United States Patent
Honjo

(10) Patent No.: US 10,741,655 B2
(45) Date of Patent: Aug. 11, 2020

(54) SEMICONDUCTOR DEVICE, MANUFACTURING METHOD OF THE SAME, SOLID-STATE IMAGING DEVICE, AND ELECTRONIC DEVICE

(71) Applicant: SONY CORPORATION, Tokyo (JP)

(72) Inventor: Akiko Honjo, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/069,286

(22) PCT Filed: Jan. 6, 2017

(86) PCT No.: PCT/JP2017/000208
§ 371 (c)(1),
(2) Date: Jul. 11, 2018

(87) PCT Pub. No.: WO2017/126332
PCT Pub. Date: Jul. 27, 2017

(65) Prior Publication Data
US 2019/0035902 A1    Jan. 31, 2019

(30) Foreign Application Priority Data
Jan. 21, 2016 (JP) ................................ 2016-009698

(51) Int. Cl.
*H01L 29/66* (2006.01)
*H01L 29/417* (2006.01)
(Continued)

(52) U.S. Cl.
CPC ...... *H01L 29/41775* (2013.01); *H01L 27/146* (2013.01); *H01L 27/148* (2013.01);
(Continued)

(58) Field of Classification Search
CPC . H01L 27/146; H01L 27/148; H01L 29/0653; H01L 29/41775; H01L 29/66659; H01L 29/78; H01L 29/7833
See application file for complete search history.

(56) References Cited

U.S. PATENT DOCUMENTS 5,973,362 A   10/1999  Park et al.
6,028,338 A    2/2000  Saito et al.
(Continued)

FOREIGN PATENT DOCUMENTS

JP   H05-075118    3/1993
JP   H10-303319   11/1998
(Continued)

OTHER PUBLICATIONS

International Search Report prepared by the Japan Patent Office dated Feb. 16, 2017, for International Application No. PCT/JP2017/000208.

*Primary Examiner* — Cuong Q Nguyen
(74) *Attorney, Agent, or Firm* — Sheridan Ross P.C.

(57) ABSTRACT

The present technology relates to a semiconductor device, a manufacturing method of a semiconductor device, a solid-state imaging device, and an electronic device capable of reducing a parasitic capacitance between a gate electrode and source/drain electrodes and reducing a leakage current. The semiconductor device includes a first impurity region formed between element isolation regions on both sides, a gate electrode formed on an upper surface of a semiconductor substrate where the element isolation regions and the first impurity region are formed so that both ends are respectively overlapped with the element isolation regions on both sides and the gate electrode is separated from the first impurity region by a predetermined distance along a planar direction, and a second impurity region formed on the semiconductor
(Continued)

substrate between the gate electrode and the first impurity region in plan view as having the same conductivity type as the first impurity region.

20 Claims, 15 Drawing Sheets

(51) Int. Cl.
  *H01L 29/78* (2006.01)
  *H01L 27/146* (2006.01)
  *H01L 27/148* (2006.01)
  *H01L 29/06* (2006.01)
  *H04N 5/369* (2011.01)

(52) U.S. Cl.
  CPC ...... *H01L 29/0653* (2013.01); *H01L 29/6659* (2013.01); *H01L 29/78* (2013.01); *H01L 29/7833* (2013.01); *H04N 5/369* (2013.01)

(56) References Cited

U.S. PATENT DOCUMENTS

| | | | |
|---|---|---|---|
| 2002/0185667 A1* | 12/2002 | Asano | H01L 27/0605 257/280 |
| 2007/0069312 A1 | 3/2007 | Satou et al. | |
| 2010/0176276 A1 | 7/2010 | Ihara | |
| 2011/0127592 A1* | 6/2011 | Yanagita | H01L 27/14603 257/291 |
| 2011/0204451 A1* | 8/2011 | Seo | H01L 29/78 257/392 |
| 2012/0199904 A1* | 8/2012 | Sasaki | H01L 29/66659 257/343 |
| 2013/0037867 A1 | 2/2013 | Adachi | |

FOREIGN PATENT DOCUMENTS

| | | |
|---|---|---|
| JP | 2001-148478 | 5/2001 |
| JP | 2003-188367 | 7/2003 |
| JP | 2006-303386 | 11/2006 |
| JP | 2007-095912 | 4/2007 |
| JP | 2010-165893 | 7/2010 |
| JP | 2010-245314 | 10/2010 |
| JP | 2010-283859 | 12/2010 |
| JP | 2013-041927 | 8/2011 |
| JP | 2012-253371 | 12/2012 |
| JP | 2015-130533 | 7/2015 |

* cited by examiner

SEMICONDUCTOR DEVICE, MANUFACTURING METHOD OF THE SAME, SOLID-STATE IMAGING DEVICE, AND ELECTRONIC DEVICE

CROSS REFERENCE TO RELATED APPLICATIONS

This application is a national stage application under 35 U.S.C. 371 and claims the benefit of PCT Application No. PCT/JP2017/000208 having an international filing date of 6 Jan. 2017, which designated the United States, which PCT application claimed the benefit of Japanese Patent Application No. 2016-009698 filed 21 Jan. 2016, the entire disclosures of each of which are incorporated herein by reference.

TECHNICAL FIELD

The present technology relates to a semiconductor device, a manufacturing method of the semiconductor device, a solid-state imaging device, and an electronic device, and more particularly, to a semiconductor device, manufacturing method of the semiconductor device, a solid-state imaging device, and an electronic device capable of reducing a parasitic capacitance between a gate electrode and source/drain electrodes and reducing a leakage current.

BACKGROUND ART

To increase an operating speed of an integrated circuit device such as a microprocessor and a memory, it is necessary to reduce a parasitic capacitance between a gate electrode and a source/drain electrode of a transistor. Furthermore, to reduce power consumption, it is necessary to reduce a leakage current. In a case where a bias applied to the gate electrode is different from a bias applied to the source/drain electrode, an electric field concentrates at ends of the gate electrode, and the leakage current occurs. To reduce the leakage current, it is necessary to relax the electric field at the end of the gate electrode.

In a FD-accumulation-type solid-state imaging device in which charges generated by a photoelectric conversion element are accumulated in a FD diffusion layer as using one of source/drain electrodes of a pixel transistor as the FD diffusion layer, low leakage is required for the FD diffusion layer. However, due to a potential difference between the gate electrodes of the transfer transistor and the reset transistor and the FD diffusion layer, electric field concentration occurs at the end of the gate electrode, and the leakage current occurs. Furthermore, in a case where a high photoelectric conversion efficiency is required, reduction in a parasitic capacitance between the gate electrode and the FD diffusion layer is required.

Therefore, Patent Document 1 discloses a technology for suppressing hot carriers and reducing the parasitic capacitance by adjusting a layout between the gate electrodes. That is, two transistors are arranged adjacent to each other, and an interval between the two gate electrodes is set to be narrow. With this structure, a width of a sidewall between the gate electrodes is narrower than a width of a sidewall formed on a side wall of a gate electrode in an isolated pattern. Therefore, a width of the sidewall on the side of a source electrode can be narrowed, and a width of the sidewall on the side of a drain electrode can be widened. By using a diffusion layer region between the gate electrodes as the source electrode, only a series resistance between the gate electrode and the source electrode is reduced, and an overlap between the gate electrode and the drain electrode is reduced. Accordingly, it is possible to suppress the generation of the hot carriers on the drain electrode side and reduce the parasitic capacitance.

Furthermore, in Patent Document 2, a structure is proposed in which a height of the gate electrode of the transfer transistor on the FD diffusion layer side is set higher than that on the photodiode side. With this structure, a width of the sidewall formed on the side surface of the gate electrode is wider only on the side having contact with the FD diffusion layer. For example, in a case of an electron-accumulation-type solid-state imaging device, N-type ions are implanted into the FD diffusion layer by self-alignment relative to the sidewall. As a result, while maintaining transfer characteristics from the photodiode, it is possible to reduce the parasitic capacitance with the FD diffusion layer and reduce the leakage current by relaxing the electric field at the end of the gate electrode of the transfer transistor.

CITATION LIST

Patent Document

Patent Document 1: Japanese Patent Application Laid-Open No. 2012-253371
Patent Document 2: Japanese Patent Application Laid-Open No. 2010-165893

SUMMARY OF THE INVENTION

Problems to be Solved by the Invention

However, in the technology disclosed in Patent Document 1, it is necessary to constantly arrange the two transistors adjacent to each other, and a distance between the gate electrodes is restricted. Therefore, the layout is restricted. In the technology disclosed in Patent Document 2, the height of the gate electrode varies depending on places, the number of processes increases. Furthermore, since the height of the gate electrode is increased, it is disadvantageous to reduce the height.

The present technology has been made in view of such a situation. A purpose of the present technology is to reduce a parasitic capacitance between a gate electrode and source/drain electrodes and reduce a leakage current.

Solutions to Problems

A semiconductor device according to a first aspect of the present technology includes a first impurity region formed between element isolation regions on both sides, a gate electrode formed on an upper surface of a semiconductor substrate where the element isolation regions and the first impurity region are formed so that both ends are respectively overlapped with the element isolation regions on both sides and the gate electrode is separated from the first impurity region by a predetermined distance along a planar direction, and a second impurity region formed on the semiconductor substrate between the gate electrode and the first impurity region in plan view as having the same conductivity type as the first impurity region, in which there are at least two kinds of separation distances between the gate electrode and the first impurity region along the planar direction, that is, a first distance and a second distance, and the separation distance of a portion having contact with at least one of the element isolation regions is the second distance longer than the first distance.

A manufacturing method of a semiconductor device according to a second aspect of the present technology includes a step of forming a first impurity region between element isolation regions on both sides, a step of forming a gate electrode on an upper surface of a semiconductor substrate where the element isolation regions and the first impurity region are formed so that both ends are respectively overlapped with the element isolation regions on both sides and the gate electrode is separated from the first impurity region by a predetermined distance along a planar direction, and a step of forming a second impurity region on the semiconductor substrate between the gate electrode and the first impurity region in plan view as having the same conductivity type as the first impurity region, in which there are at least two kinds of separation distances between the gate electrode and the first impurity region along the planar direction, that is, a first distance and a second distance, and the separation distance of a part having contact with at least one of the element isolation regions is formed to be the second distance longer than the first distance.

In the first and the second aspects of the present technology, a first impurity region is formed between element isolation regions on both sides, a gate electrode is formed on an upper surface of a semiconductor substrate where the element isolation regions and the first impurity region are formed so that both ends are respectively overlapped with the element isolation regions on both sides and the gate electrode is separated from the first impurity region by a predetermined distance along a planar direction, and a second impurity region is formed on the semiconductor substrate between the gate electrode and the first impurity region in plan view as having the same conductivity type as the first impurity region. There are at least two kinds of separation distances between the gate electrode and the first impurity region along the planar direction, that is, a first distance and a second distance, and the separation distance of a part having contact with at least one of the element isolation regions is formed to be the second distance longer than the first distance.

An solid-state imaging device according to a third aspect of the present technology includes a photoelectric converter which generates a charge according to a received light amount and accumulate the charge, a charge holding unit which holds the charge generated by the photoelectric converter to read the charge, a transfer transistor which transfers the charge from the photoelectric converter to the charge holding unit, and a reset transistor which resets the charge holding unit, in which the charge holding unit is formed by a first impurity region formed between element isolation regions on both sides, one of or both of gate electrodes of the transfer transistor or the reset transistor are formed on an upper surface of a semiconductor substrate where the element isolation regions and the first impurity region are formed so that both ends are respectively overlapped with the element isolation regions on both sides and the gate electrode is separated from the first impurity region by a predetermined distance along a planar direction, a second impurity region having the same conductivity type as the first impurity region is formed on the semiconductor substrate between the gate electrode and the first impurity region in plan view, and there are at least two kinds of separation distances between the gate electrode and the first impurity region along a planar direction, that is, a first distance and a second distance, and the separation distance of a portion having contact with at least one of the element isolation regions is the second distance longer than the first distance.

An electronic device according to a fourth aspect of the present technology includes a solid-state imaging device including a photoelectric converter which generates a charge according to a received light amount and accumulate the charge, a charge holding unit which holds the charge generated by the photoelectric converter to read the charge, a transfer transistor which transfers the charge from the photoelectric converter to the charge holding unit, and a reset transistor which resets the charge holding unit, in which the charge holding unit is formed by a first impurity region formed between element isolation regions on both sides, one of or both of gate electrodes of the transfer transistor or the reset transistor are formed on an upper surface of a semiconductor substrate where the element isolation regions and the first impurity region are formed so that both ends are respectively overlapped with the element isolation regions on both sides and the gate electrode is separated from the first impurity region by a predetermined distance along a planar direction, a second impurity region having the same conductivity type as the first impurity region is formed on the semiconductor substrate between the gate electrode and the first impurity region in plan view, and there are at least two kinds of separation distances between the gate electrode and the first impurity region along a planar direction, that is, a first distance and a second distance, and the separation distance of a portion having contact with at least one of the element isolation regions is the second distance longer than the first distance.

In the third and the fourth aspects of the present technology, as the charge holding unit, the first impurity region is formed between the element isolation regions on both sides, one of or both of the gate electrodes of the transfer transistor or the reset transistor is formed on the upper surface of the semiconductor substrate where the element isolation regions and the first impurity region are formed so that both ends are overlapped with the element isolation regions on both sides and the gate electrode is separated from the first impurity region by a predetermined distance along a planer direction, a second impurity region having the same conductivity type as the first impurity region is formed on the semiconductor substrate between the gate electrode and the first impurity region in plan view, and there are at least two kinds of separation distances between the gate electrode and the first impurity region along a planar direction, that is, a first distance and a second distance, and the separation distance of a portion having contact with at least one of the element isolation regions is the second distance longer than the first distance.

The semiconductor device, the solid-state imaging device, and the electronic device may be independent devices or may be modules incorporated in other devices.

Effects of the Invention

According to the first to third aspects of the present technology, a parasitic capacitance between a gate electrode and source/drain electrodes can be reduced, and a leakage current can be reduced.

Note that the effects described herein are not necessarily limited and that the effect may be any effects described in the present disclosure.

MODE FOR CARRYING OUT THE INVENTION

Embodiments for carrying out the present technology (referred to as an embodiment below) will be described below. Note that, the description will be in the following order.

1. First Embodiment (Exemplary Configuration of Transistor Having Projected Low-Concentration N-Type Impurity Region)
2. Second Embodiment (Exemplary Configuration of Transistor Having Projected Gate Electrode)
3. Example of Application to Solid-State Imaging Device
4. Example of Application to Electronic Device 1. First Embodiment <Plan View and Cross-Sectional View of Transistor>

Figure 1:
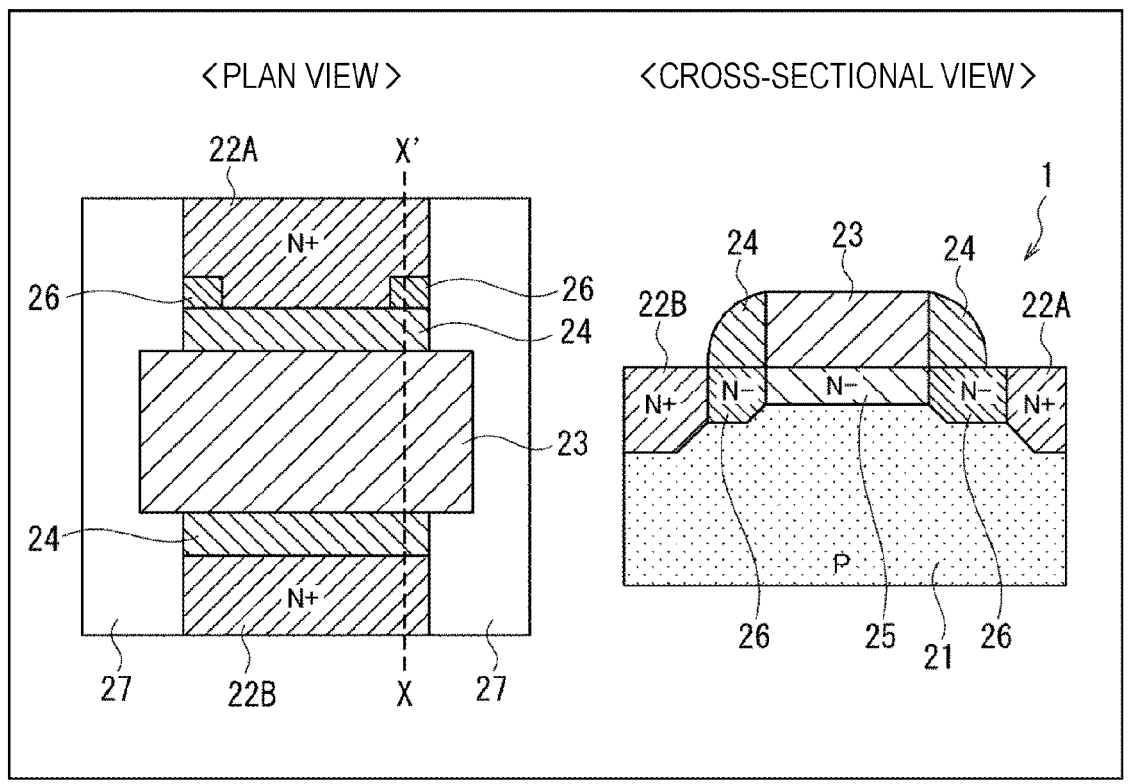
FIG. 1 is a plan view and a cross-sectional view of a first embodiment of a transistor to which the present technology is applied.

FIG. 1 is a plan view and a cross-sectional view of a first embodiment of a transistor to which the present technology is applied. Note that the cross-sectional view illustrates a cross-section taken along a line X-X' illustrated in the plan view.

A transistor 1 according to the first embodiment illustrated in FIG. 1 includes N-type (second conductivity type) impurity regions 22A and 22B on a P-type (first conductivity type) semiconductor substrate 21 and a gate electrode 23 on the upper surface of the semiconductor substrate 21. One of the impurity regions 22A and 22B is a source electrode, and the other one is a drain electrode. Hereinafter, the N-type impurity regions 22A and 22B are respectively indicated as source/drain electrodes 22A and 22B. In a case where it is not necessary to particularly distinguish both impurity regions, the impurity regions are simply referred to as source/drain electrodes 22.

Sidewalls 24 are formed on side surfaces (side walls) of the gate electrode 23 formed on the upper surface of the semiconductor substrate 21.

In a region below the gate electrode 23 of the semiconductor substrate 21, an N-type impurity region 25 is formed, and N-type impurity regions 26 are formed between the impurity region 25 and the source/drain electrodes 22.

The N-type impurity region 25 below the gate electrode 23 is an impurity region formed to adjust a threshold of the transistor 1. On the other hand, the N-type impurity region 26 positioned between the N-type impurity region 25 and the source/drain electrode 22 is an impurity region formed to suppress hot carriers. Since impurity concentrations of the impurity regions 25 and 26 are formed to be lower than an impurity concentration of the source/drain electrode 22, the source/drain electrode 22 is written as "N +" and the impurity regions 25 and 26 are written as "N −" in FIG. 1.

The description herein will be made while assuming that a direction in which the source/drain electrodes 22 and the impurity regions 25 and 26 formed on the semiconductor substrate 21 are arranged in FIG. 1 be a vertical direction and a direction perpendicular to the arrangement direction of the source/drain electrodes 22 and the impurity regions 25 and 26 (horizontal direction in plan view) be a lateral direction.

As illustrated in the plan view in FIG. 1, element isolation regions 27 are formed on both sides (right side and left side) of the source/drain electrodes 22 and impurity regions 25 and 26 formed on the semiconductor substrate 21 in the lateral direction. The element isolation region 27 includes, for example, local oxidation of silicon (LOCOS), shallow trench isolation (STI), a high-concentration P-type diffusion layer, and the like.

As apparent from the plan view, the sidewalls 24 are formed on two side surfaces of rectangular four side surfaces of the gate electrode 23 formed on the semiconductor substrate 21 in a direction where the source/drain electrodes 22 are formed. Note that the sidewalls 24 may be formed on an entire outer periphery of the gate electrode 23 as in a second embodiment described later.

In plan view, low-concentration N-type impurity regions 26 are formed in portions respectively having contact with the element isolation regions 27 on both sides between the source/drain electrode 22A and the sidewall 24.

Figure 2:
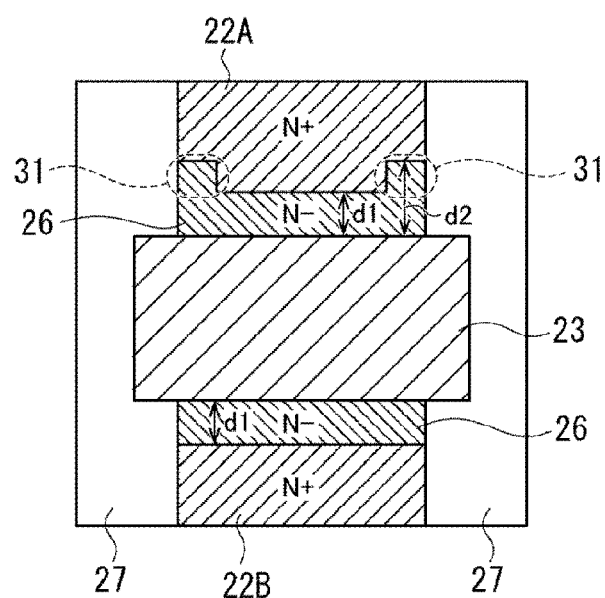
FIG. 2 is a plan view in which sidewalls are omitted from the plan view in FIG. 1.

FIG. 2 is a plan view in which the sidewalls 24 are omitted from the plan view of FIG. 1 to make it easy to see a region where the low-concentration N-type impurity region 26 is formed.

As illustrated in FIG. 2, the low-concentration N-type impurity region 26 is formed between the gate electrode 23 and the high-concentration N-type source/drain electrode 22A in plan view. A planar shape of the low-concentration N-type impurity region 26 is projected toward the source/drain electrode 22A (in vertical direction) near the element isolation regions 27 on both sides.

In other words, the low-concentration N-type impurity region 26 has projections 31 projected toward the source/drain electrode 22A in portions having contact with the element isolation regions 27 on both sides in plan view. When it is assumed that a separation distance along the vertical direction between the gate electrode 23 and the source/drain electrode 22A in a central portion having no contact with the element isolation region 27 (distance along vertical direction of low-concentration N-type impurity region 26) be a distance d1, a separation distance along the vertical direction between the gate electrode 23 and the source/drain electrode 22A in a portion having contact with the element isolation region 27 (distance along vertical direction of low-concentration N-type impurity region 26 including projection 31) is a distance d2 longer than the distance d1 (d1<d2).

As described above, the transistor 1 according to the first embodiment which is an N-type transistor and includes the source/drain electrodes 22A and 22B which are formed between the element isolation regions 27 on both sides, the gate electrode 23 which is formed on the upper surface of the semiconductor substrate 21 where the element isolation regions 27 and the source/drain electrodes 22A and 22B are formed so that both ends are overlapped with the element isolation regions 27 on both sides and the gate electrode 23 is separated from the source/drain electrodes 22A and 22B in a planar direction (vertical direction) by a predetermined distance, the impurity regions 26 which are formed on the semiconductor substrate 21 between the gate electrode 23 and the source/drain electrodes 22A and 22B in plan view and have the same conductivity type (N-type) as the source/drain electrodes 22A and 22B. Here, there are at least two kinds of separation distances, i.e., a first separation distance d1 and a second separation distance d2, between the gate electrode 23 and the source/drain electrodes 22A and 22B along the planar direction, the separation distance of portions having contact with the element isolation regions 27 on both sides is the second distance d2 longer than the first separation distance d1 of the central portion.

Figure 3:
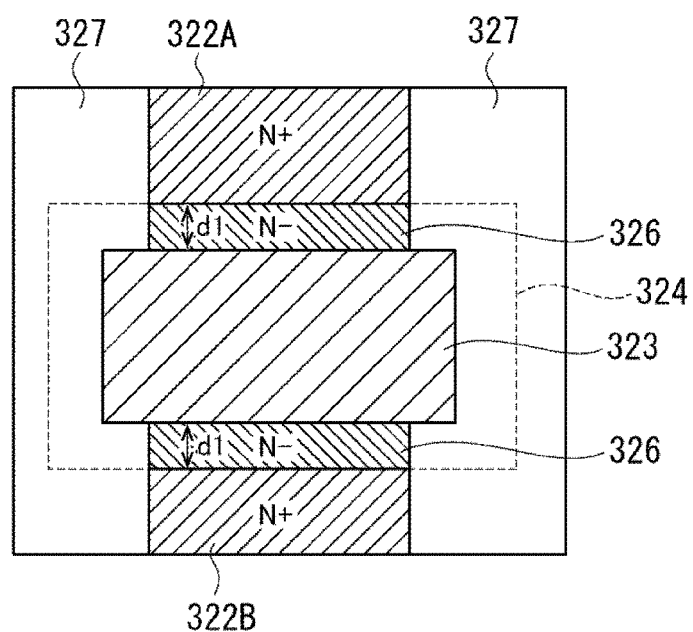
FIG. 3 is a plan view of a structure of a general transistor.

FIG. 3 is a plan view of a structure of a general transistor to simply describe characteristics of the transistor 1. Furthermore, in FIG. 3, to easily view a region where a low-concentration N-type impurity region 326 is formed, only the outermost periphery of a region where a sidewall 324 is formed is indicated by a broken line.

In general, as illustrated in FIG. 3, the transistor is formed so that separation distances between a gate electrode 323 and source/drain electrodes 322A and 322B along the vertical direction, in other words, a distance of the low-concentration N-type impurity region 326 along the vertical direction is uniformly provided to be a predetermined distance (for example, separation distance d1).

On the other hand, as illustrated in FIG. 2, the transistor 1 according to the first embodiment is formed so that the separation distance of the portions having contact with the element isolation regions 27 on both sides is the second distance d2 and the separation distance of the central portion having no contact with the element isolation region 27 is the first separation distance d1 shorter than the second distance d2.

To increase an operating speed of the transistor, it is necessary to reduce a parasitic capacitance between the gate electrode and the source/drain electrodes of the transistor. Furthermore, to reduce power consumption, it is necessary to reduce a leakage current.

In the low-concentration N-type impurity region 26 between the gate electrode 23 and the source/drain electrode 22A, in a region of the transistor 1 having contact with the element isolation region 27, there are many crystal defects due to a process of the element isolation region 27. Therefore, an electric field relaxation of the region having contact with the element isolation region 27 is greatly effective in reducing the leakage current. Therefore, in the transistor 1, the separation distance d2 along the vertical direction of the portion having contact with the element isolation region 27 in the low-concentration N-type impurity region 26 between the gate electrode 23 and the source/drain electrode 22A is longer than the separation distance d1 along the vertical direction of the central portion having no contact with the element isolation region 27. With this structure, the parasitic capacitance between the gate electrode 23 and the source/drain electrode 22A can be reduced, and the leakage current can be reduced.

Note that switching characteristics of the transistor 1 is determined by a shortest distance of the distances along the vertical direction between the gate electrode 23 and the source/drain electrode 22A. Therefore, the switching characteristics of the transistor 1 is determined by the separation distance d1 out of the two kinds of separation distances d1 and d2, and the transistor 1 has the same characteristics as the transistor in FIG. 3 having the uniform separation distance d1. Therefore, the existence of the projection 31 does not largely deteriorate the switching characteristics.

<First Manufacturing Method According to the First Embodiment>

Next, a first manufacturing method of the transistor 1 according to the first embodiment will be described with reference to FIGS. 4 and 5.

Figure 4:
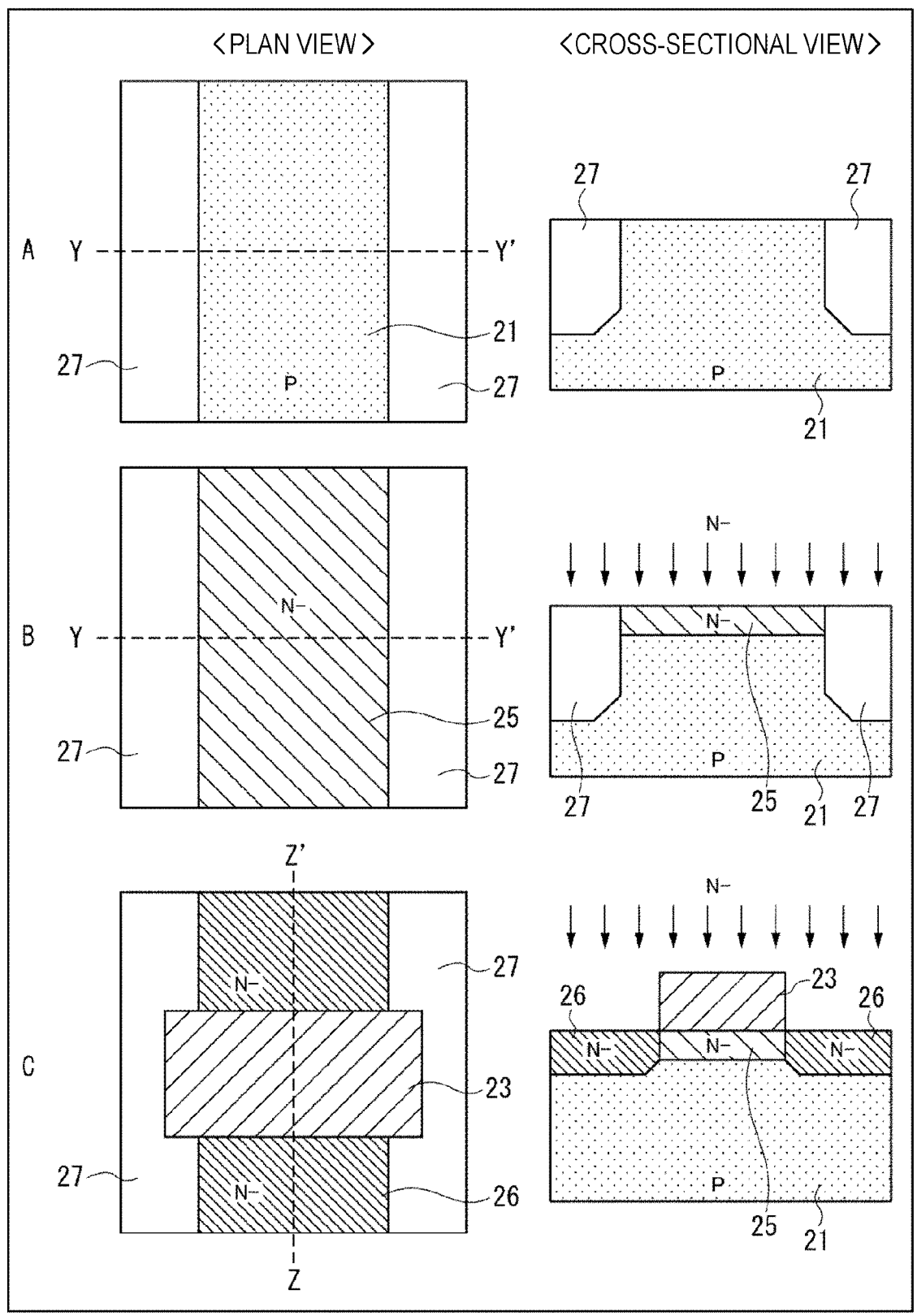
FIG. 4 is a diagram to describe a first manufacturing method of the transistor according to the first embodiment.
Figure 5:
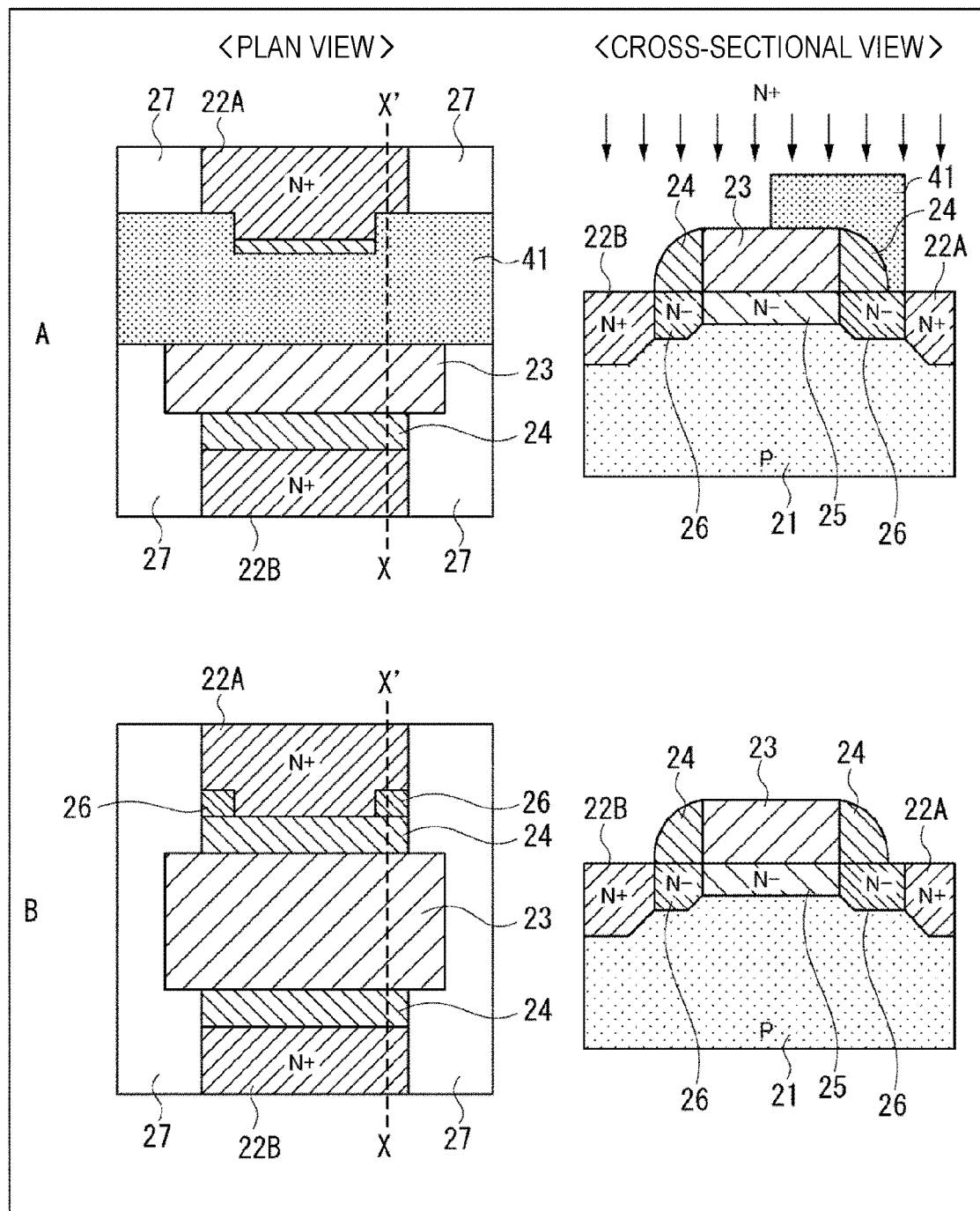
FIG. 5 is a diagram to describe the first manufacturing method of the transistor according to the first embodiment.

Furthermore, in FIGS. 4 and 5, a plan view and a cross-sectional view are illustrated side by side similarly to FIG. 1. The cross-sectional views in A and B of FIG. 4 are cross-sectional views taken along a Y-Y' line in the plan views. The cross-sectional view in C of FIG. 4 is a cross-sectional view taken along a Z-Z' line in the plan view. The cross-sectional views in A and B of FIG. 5 are cross-sectional views taken along a X-X' line in the plan views.

First, as illustrated in A of FIG. 4, the element isolation regions 27 for defining an active region are formed on the P-type semiconductor substrate 21. As described above, the element isolation region 27 includes, for example, LOCOS, STI, a high-concentration P-type diffusion layer, and the like.

Next, as illustrated in B of FIG. 4, the low-concentration N-type impurity region 25 is formed by ion-implanting N-type impurities into the active region of the semiconductor substrate 21 sandwiched between the element isolation regions 27 on both sides. As the N-type impurities to be ion-implanted, for example, arsenic, phosphorus, antimony, and the like can be employed. A dose amount is set to, for example, 1e12 cm-2 to 1e14 cm-2, or the like.

Next, as illustrated in C of FIG. 4, the gate electrode 23 is formed on the upper surface of the semiconductor substrate 21 using, for example, polysilicon and the like. The gate electrode 23 is formed so that the lateral direction is provided as a longitudinal direction of the rectangular shape and both ends in the longitudinal direction are overlapped with the element isolation regions 27 on both sides in plan view.

Then, the N-type impurities of the dose amount of, for example, about 1e12 cm-2 to 1e14 cm-2 by self-alignment relative to the gate electrode 23, and the low-concentration N-type impurity region 26 is formed. A portion under the gate electrode 23 is the low-concentration N-type impurity region 25 to adjust the threshold of the transistor 1.

Next, as illustrated in A of FIG. 5, after the sidewall 24 has been formed on the side wall of the gate electrode 23 on the side where the low-concentration N-type impurity region 26 is formed, a resist 41 is patterned by photolithography. After that, as using the resist 41 as a mask, the N-type impurities of the dose amount of, for example, about 1e14 cm-2 to 1e16 cm-2 are ion-implanted, and high-concentration N-type source/drain electrodes 22A and 22B are formed.

As illustrated in the plan view and the cross-sectional view in A of FIG. 5, the resist 41 on the side of the source/drain electrode 22A is patterned to be larger than the width of the sidewall 24 and to cover a part of the low-concentration N-type impurity regions 26 provided on the sides of the element isolation regions 27 near the boundaries with the element isolation regions 27. In the central portion which is not a portion near the boundaries with the element isolation regions 27, the resist 41 is patterned to be smaller than the width of the sidewall 24 so as to expose a part of the sidewall 24. In other words, the resist 41 is formed to mask the regions of the low-concentration N-type impurity region 26 to be the projections 31.

On the other hand, the side of the source/drain electrode 22B of the resist 41 is patterned so that the sidewall 24 on the side of the source/drain electrode 22B and the gate electrode 23 near the sidewall 24 are exposed.

In the low-concentration N-type impurity region 26 formed in C of FIG. 4, regions into which the N-type impurities are further ion-implanted become source/drain electrodes 22A and 22B, and the region masked by the resist 41 and the sidewall 24 becomes the low-concentration N-type impurity region 26 to form a lightly doped drain (LDD).

Finally, as illustrated in B of FIG. 5, after the resist 41 is peeled, the transistor 1 in FIG. 1 is completed by executing annealing processing to activate the impurities.

<Second Manufacturing Method According to the First Embodiment>

Next, a second manufacturing method of the transistor 1 according to the first embodiment will be described with reference to FIG. 6.

The process described with reference to A to C of FIG. 4 in the first manufacturing method is performed similarly in the second manufacturing method. Therefore, the description thereof will be omitted.

Figure 6:
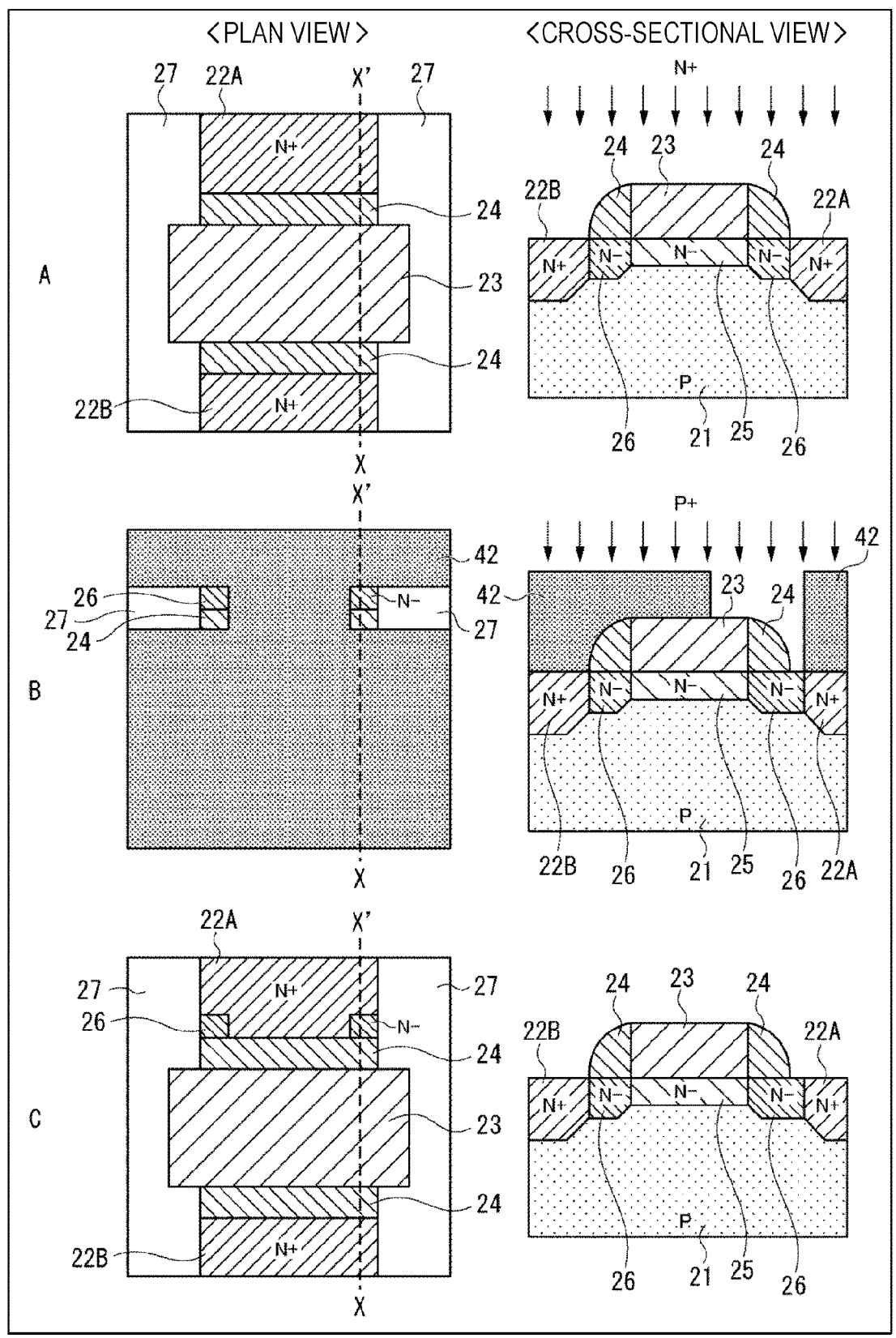
FIG. 6 is a diagram to describe a second manufacturing method of the transistor according to the first embodiment.

As illustrated in C of FIG. 4, after the gate electrode 23 and the low-concentration N-type impurity region 26 have been formed, as illustrated in A of FIG. 6, the sidewalls 24 are formed on the side walls of the gate electrode 23 where the low-concentration N-type impurity regions 26 are formed. Thereafter, the N-type impurities of the dose amount of, for example, about 1e14 cm-2 to 1e16 cm-2 are ion-implanted by self-alignment relative to the sidewalls 24. With this processing, the high-concentration N-type source/drain electrodes 22A and 22B are formed.

Next, a resist 42 to be a mask to return a part of the formed high-concentration N-type source/drain electrode 22A by P-type impurities is patterned.

As illustrated in B of FIG. 6, the resist 42 on the high-concentration N-type source/drain electrode 22A is patterned so that only a portion near the region where the sidewall 24 has contact with the element isolation region 27 is opened. In other words, the resist 42 is formed so that the region to be the projection 31 of the low-concentration N-type impurity region 26 is opened.

The dose amount of the P-type impurities is, for example, about 1e14 cm-2 to 1e16 cm-2. The low-concentration N-type impurity region 26 to be the projection 31 is formed by returning the P-type impurities relative to the opened region of the high-concentration N-type source/drain electrode 22A.

Finally, as illustrated in C of FIG. 6, after the resist 42 is peeled, the transistor 1 in FIG. 1 is completed by executing annealing processing to activate the impurities.

Modification of First Embodiment

Next, a modification of the first embodiment will be described with reference to A to C of FIG. 7. A to C of FIG. 7 are plan views of the modification of the first embodiment corresponding to the plan view in FIG. 2 in which the sidewalls 24 are omitted.

In the first embodiment described above, the low-concentration N-type impurity region 26 has the two projections 31. That is, the projections 31 are formed at the respective portions in contact with the element isolation regions 27 on both sides. However, as illustrated in A of FIG. 7, it is preferable that the projection 31 be provided on at least one of the element isolation regions 27 on both sides. In the example in A of FIG. 7, the projection 31 is formed in only a portion having contact with the right element isolation region 27.

Figure 7:
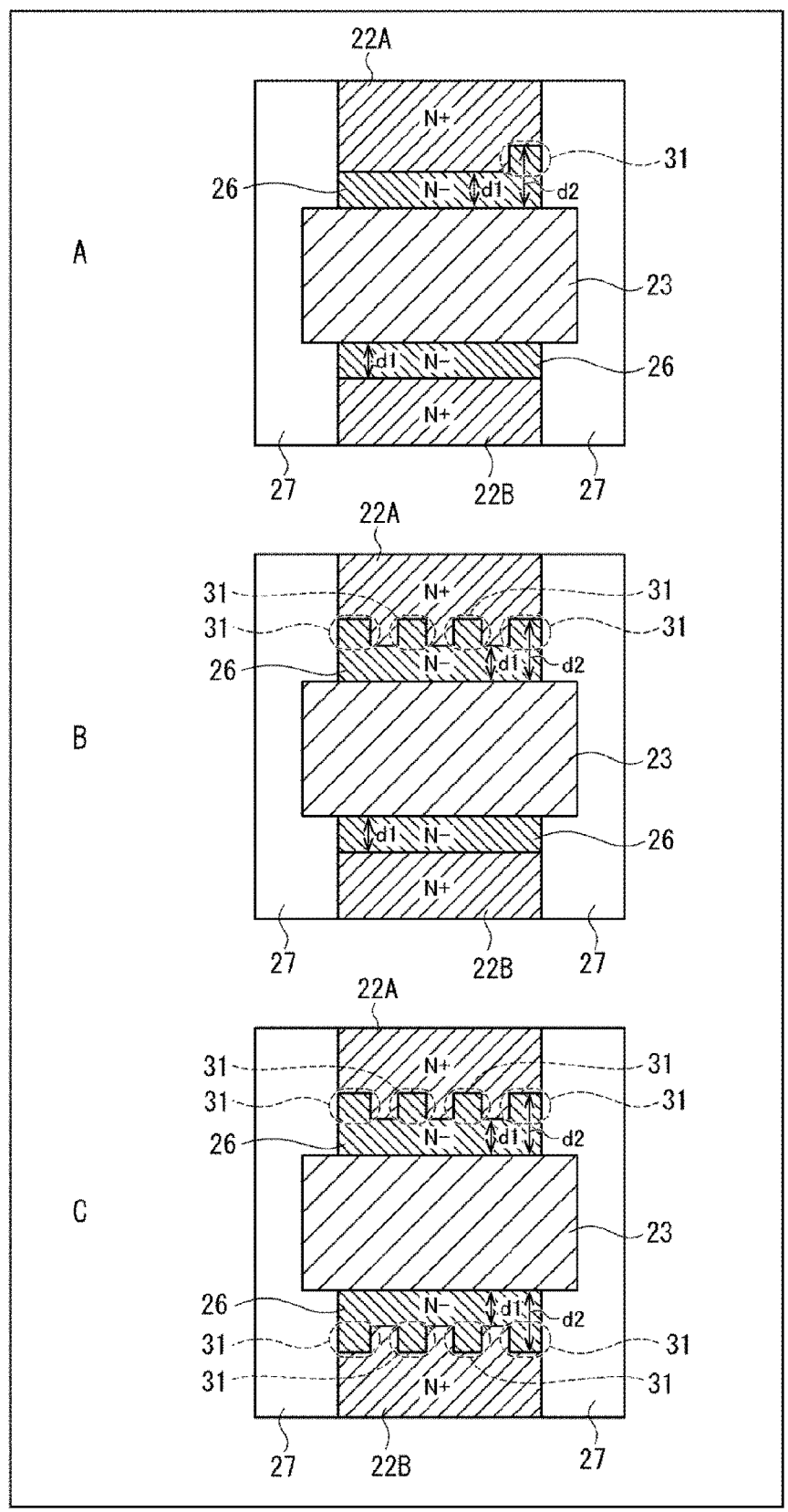
FIG. 7 is a diagram of a modification of the first embodiment.

Furthermore, as illustrated in B of FIG. 7, not only in two portions having contact with the element isolation regions 27 on both sides but also in the central portion having no contact with the element isolation region 27, one or more projections 31 may be formed. In the example in B of FIG. 7, the two projections 31 on both ends having contact with the element isolation regions 27 are formed, and in addition, two projections 31 are formed in the central portion.

In addition, in the first embodiment described above, only the low-concentration N-type impurity region 26 on the side of the source/drain electrode 22A which is one of the source/drain electrodes 22A and 22B has one or more projections 31. However, as illustrated in C of FIG. 7, for example, the low-concentration N-type impurity region 26 on the side of the source/drain electrode 22B may have one or more projections 31. In the example in C of FIG. 7, the low-concentration N-type impurity region 26 on the side of the source/drain electrode 22B has the same shape as the low-concentration N-type impurity region 26 having the four projections 31 illustrated in B of FIG. 7. However, a structure is available in which the low-concentration N-type impurity region 26 on the side of the source/drain electrode 22B has the same shape as the low-concentration N-type impurity region 26 on the side of the source/drain electrode 22A in A of FIG. 7 or FIG. 2.

2. Second Embodiment

<Plan View and Cross-Sectional View of Transistor>

Figure 8:
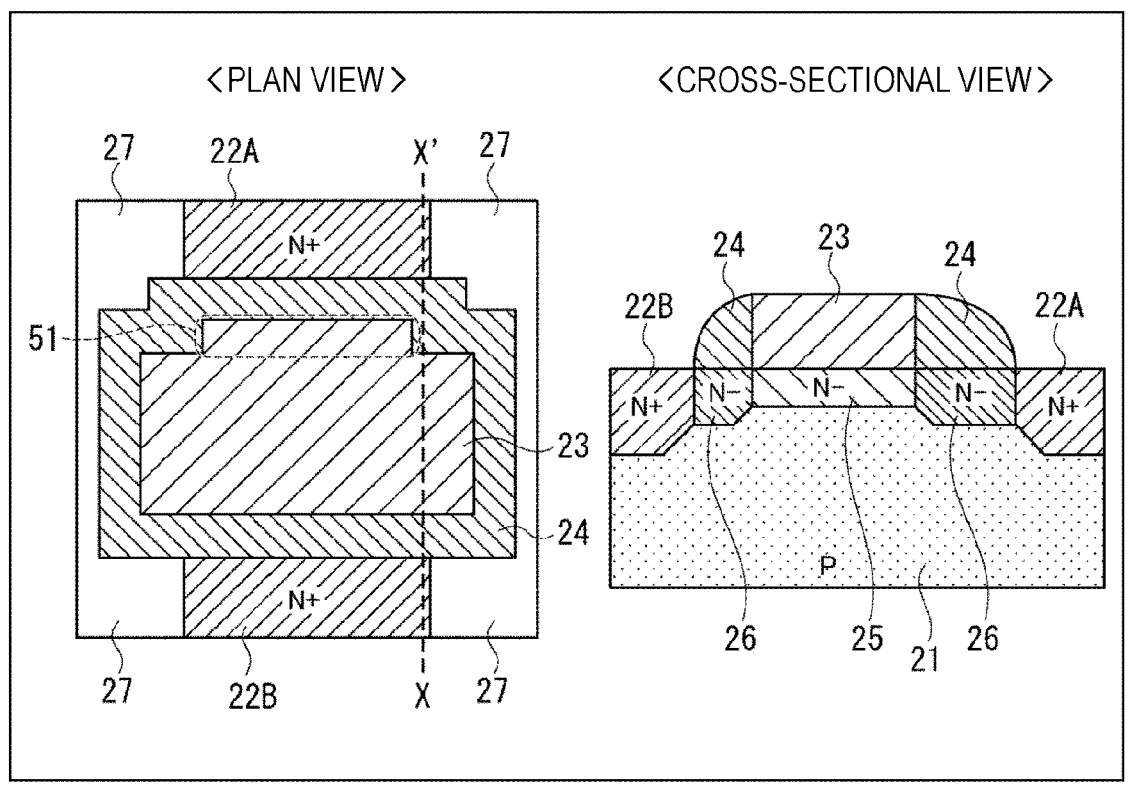
FIG. 8 is a plan view and a cross-sectional view of a second embodiment of a transistor to which the present technology is applied.

FIG. 8 is a plan view and a cross-sectional view of a second embodiment of a transistor to which the present technology is applied. Note that the cross-sectional view illustrates a cross-section taken along a X-X' line illustrated in the plan view.

In the second embodiment, components common to those of the first embodiment are denoted with the same reference numerals, and the description thereof will be omitted. The description will be made as focusing on a part different from the first embodiment.

In the second embodiment, as illustrated in the plan view in FIG. 8, a shape of a gate electrode 23 in plan view is not a rectangular shape as in the first embodiment and is a shape having a projection 51 projected toward a source/drain electrode 22A. A sidewall 24 is formed on an entire outer periphery of the gate electrode 23 along the shape of the gate electrode 23 having the projection 51.

Figure 9:
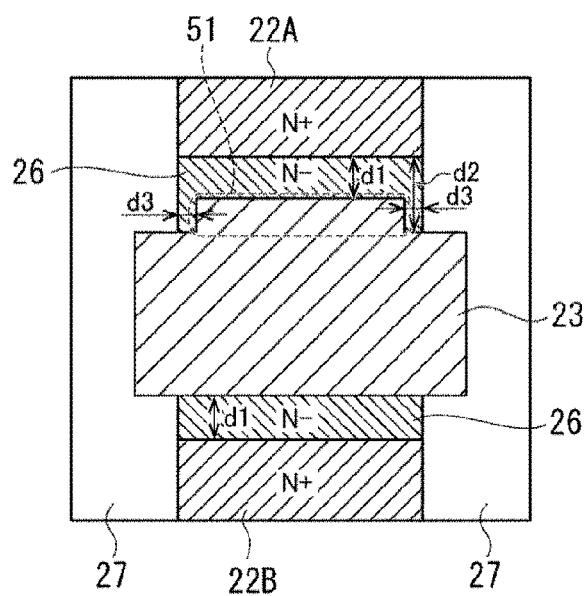
FIG. 9 is a plan view in which sidewalls are omitted from the plan view in FIG. 8.

FIG. 9 is a plan view in which the sidewalls 24 are omitted from the plan view of FIG. 8 to make it easy to see a region where a low-concentration N-type impurity region 26 is formed.

As illustrated in FIG. 9, the gate electrode 23 has the projection 51 projected toward the source/drain electrode 22A so that a separation distance along a vertical direction between the gate electrode 23 and the source/drain electrode 22A (distance along vertical direction of low-concentration N-type impurity region 26) is a distance d1 in a portion where the projection 51 is provided and a distance d2 longer than the distance d1 where the projection 51 is not provided (d1<d2).

Furthermore, a separation distance d3 along a lateral direction between the projection 51 and the element isolation region 27 is the same as or shorter than the minimum value of the separation distance along the vertical direction between the gate electrode 23 and the source/drain electrode 22A. In the example in FIG. 9, the projection 51 of the gate electrode 23 is formed so that the separation distance d3 along the lateral direction between the projection 51 and the element isolation region 27 is shorter than the distance d1 which is the minimum value of the separation distance along the vertical direction between the gate electrode 23 and the source/drain electrode 22A (d3<d1).

In addition, regarding a relation between the widths (sidewall width) along the vertical direction and the lateral direction of the sidewall 24 formed around the gate electrode 23, the projection 51 of the gate electrode 23 is formed so that the separation distance d3 along the lateral direction between the projection 51 and the element isolation region 27 is the same as or shorter than the sidewall width. In the example in FIG. 9, the separation distance d3 along the lateral direction between the projection 51 and the element isolation region 27 is shorter than the sidewall width.

As described above, the transistor 1 according to the second embodiment which is an N-type transistor and includes the source/drain electrodes 22A and 22B which are formed between the element isolation regions 27 on both sides, the gate electrode 23 which is formed on an upper surface of a semiconductor substrate 21 where the element isolation regions 27 and the source/drain electrodes 22A and 22B are formed so that both ends are overlapped with the element isolation regions 27 on both sides and the gate electrode 23 is separated from the source/drain electrodes 22A and 22B in a planar direction by a predetermined distance, the impurity regions 26 which are formed on the semiconductor substrate 21 between the gate electrode 23 and the source/drain electrodes 22A and 22B in plan view and have the same conductivity type (N-type) as the source/drain electrodes 22A and 22B. Here, there are at least two kinds of separation distances, i.e., a first separation distance d1 and a second separation distance d2, between the gate electrode 23 and the source/drain electrodes 22A and 22B along the planar direction, the separation distance of portions having contact with the element isolation regions 27 on both sides is the second distance d2 longer than the first separation distance d1.

In the transistor 1 according to the second embodiment, the separation distance d2 along the vertical direction of the portion having contact with the element isolation region 27 in the impurity region 26 between the gate electrode 23 and the source/drain electrode 22A is longer than the separation distance d1 along the vertical direction of the central portion having no contact with the element isolation region 27. With this structure, a parasitic capacitance between the gate electrode 23 and the source/drain electrode 11A can be reduced, and a leakage current can be reduced.

Furthermore, in the second embodiment, switching characteristics of the transistor 1 is determined by the shortest distance of the distances between the gate electrode 23 and the source/drain electrode 22A. Therefore, the switching characteristics of the transistor 1 is determined by the separation distance d1 out of the two kinds of separation distances d1 and d2, and the transistor 1 has the same characteristics as the transistor in FIG. 3 having the uniform separation distance d1. Therefore, the existence of the projection 51 does not largely deteriorate the switching characteristics.

<Manufacturing Method According to the Second Embodiment>

Next, a manufacturing method of the transistor 1 according to the second embodiment will be described with reference to FIGS. 10 and 11.

Figure 10:
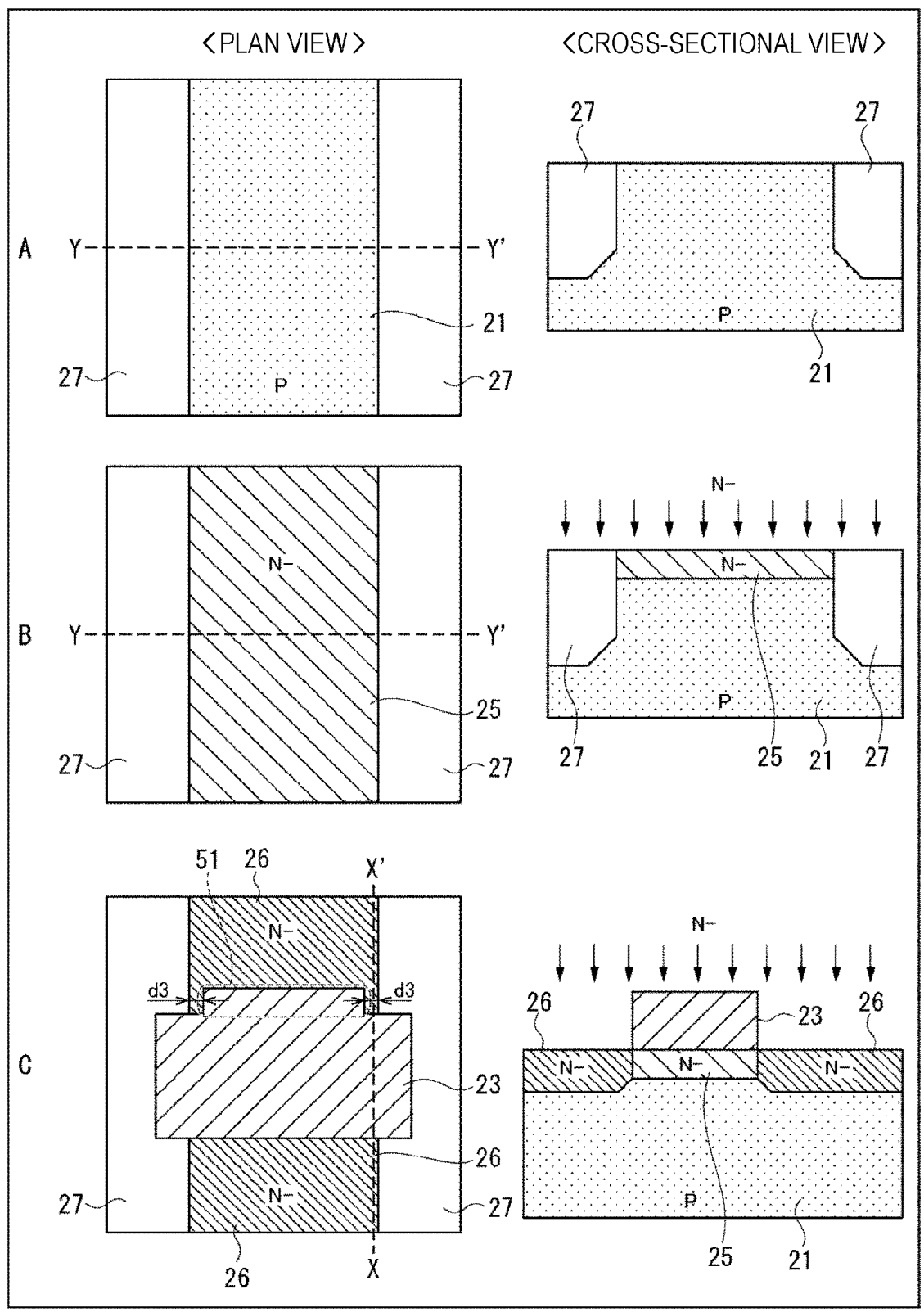
FIG. 10 is a diagram to describe a manufacturing method of the transistor according to the second embodiment.
Figure 11:
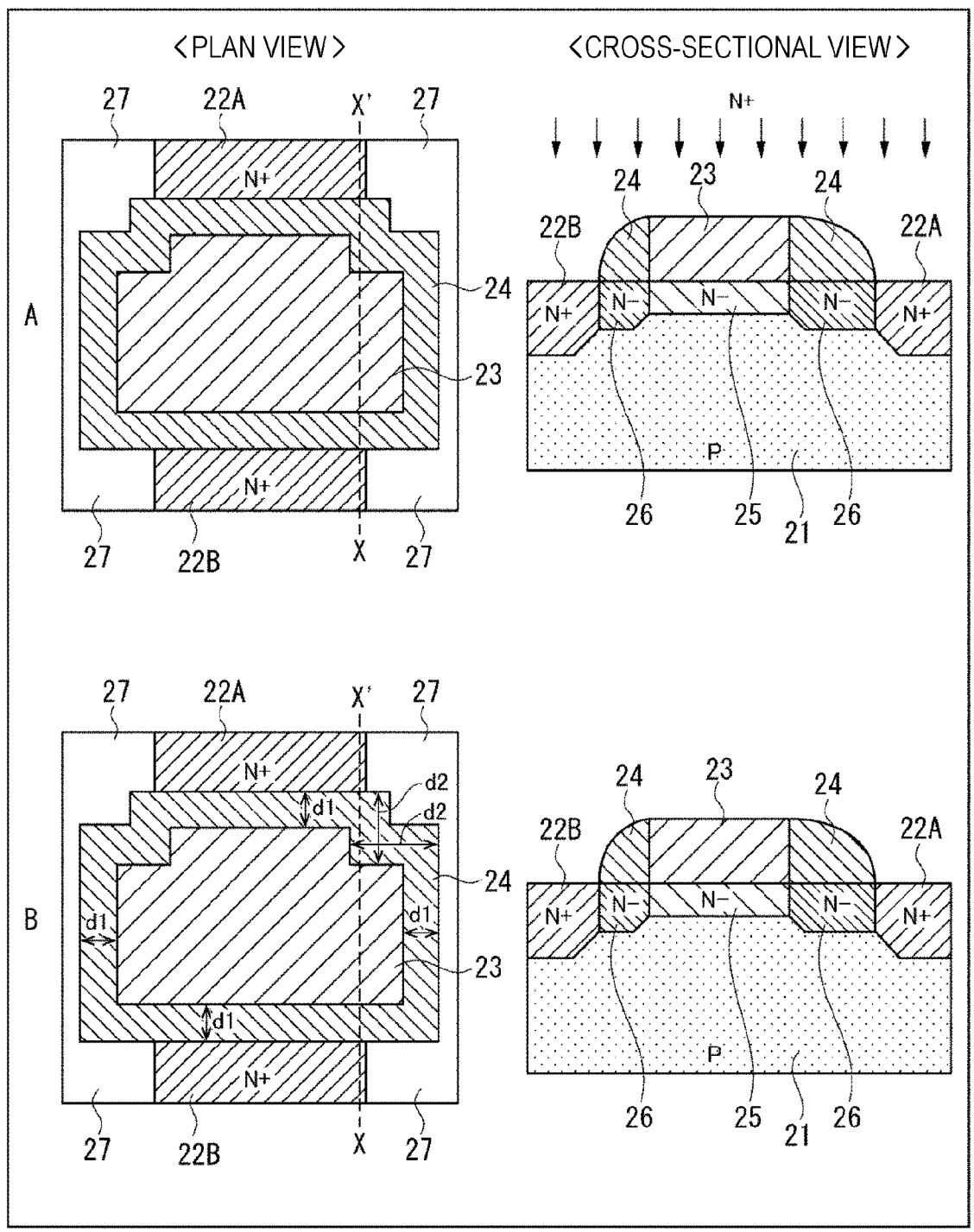
FIG. 11 is a diagram to describe the manufacturing method of the transistor according to the second embodiment.

In FIGS. 10 and 11, a plan view and a cross-sectional view are illustrated side by side similarly to FIG. 8. The cross-sectional views in A and B of FIG. 10 are cross-sectional views taken along a Y-Y' line in the plan views. The cross-sectional views in C of FIG. 10 and A and B of FIG. 11 are cross-sectional views taken along a X-X' line in the plan view.

First, as illustrated in A of FIG. 10, the element isolation regions 27 for defining an active region are formed on the P-type semiconductor substrate 21. The element isolation region 27 includes, for example, LOCOS, STI, a high-concentration P-type diffusion layer, and the like.

Next, as illustrated in B of FIG. 10, a low-concentration N-type impurity region 25 is formed by ion-implanting N-type impurities into the active region of the semiconductor substrate 21 sandwiched between the element isolation regions 27 on both sides. As the N-type impurities to be ion-implanted, for example, arsenic, phosphorus, antimony, and the like can be employed. A dose amount is set to, for example, 1e12 cm-2 to 1e14 cm-2, or the like.

Next, as illustrated in C of FIG. 10, the gate electrode 23 is formed on the upper surface of the semiconductor substrate 21 using, for example, polysilicon and the like. The gate electrode 23 is formed so that the lateral direction is provided as a longitudinal direction of the rectangular shape and both ends in the longitudinal direction are overlapped with the element isolation regions 27 on both sides in plan view. Furthermore, the gate electrode 23 has the projection 51 projected toward the source/drain electrode 22A to be formed in a subsequent process and is formed so that a distance d3 along the lateral direction between the projection 51 and the element isolation region 27 is shorter than the separation distance d1 along the vertical direction between the source/drain electrode 22A to be formed later and the gate electrode 23 (d3<d1).

Then, the N-type impurities of the dose amount of, for example, about 1e12 cm-2 to 1e14 cm-2 are ion-implanted by self-alignment relative to the formed gate electrode 23, and the low-concentration N-type impurity region 26 is formed. A portion under the gate electrode 23 is the low-concentration N-type impurity region 25 to adjust a threshold of the transistor 1.

Next, as illustrated in A of FIG. 11, the sidewall 24 is formed on the side wall of an entire outer periphery of the gate electrode 23 by etching back to the gate electrode 23. Thereafter, the N-type impurities of the dose amount of, for example, about 1e14 cm-2 to 1e16 cm-2 are ion-implanted by self-alignment relative to the formed sidewalls 24. With this processing, the high-concentration N-type source/drain electrodes 22A and 22B are formed.

As described above, since the projection 51 is formed so that the distance d3 along the lateral direction between the projection 51 of the gate electrode 23 and the element isolation region 27 is shorter than the width of the sidewall 24, the upper surface of the low-concentration N-type impurity region 26 between the projection 51 of the gate electrode 23 and the element isolation region 27 is covered with the sidewall 24.

Furthermore, by adjusting an etch-back amount so that the sidewall 24 secures a predetermined distance d1 along both the vertical direction and the lateral direction on the outer periphery of the gate electrode 23, as illustrated in B of FIG. 11, the width of the sidewall 24 along the vertical direction and the lateral direction near both ends of the side of the gate electrode 23 where the projection 51 is formed is a width d2 wider than the other width d1 (d1<d2).

Finally, the transistor 1 in FIG. 8 is completed by executing annealing processing to activate the impurities.

Modification of Second Embodiment

Next, a modification of the second embodiment will be described with reference to A to C of FIG. 12. A to C of FIG. 12 are plan views of the modification of the second embodiment corresponding to the plan view in FIG. 9 in which the sidewalls 24 are omitted.

In the second embodiment described above, as illustrated in FIG. 9, the projection 51 of the gate electrode 23 is formed so that the width of the projection 51 along the lateral direction is within the low-concentration N-type impurity region 26. Accordingly, at each of the two portions of the gate electrode 23 having contact with the element isolation regions 27 on both sides, the separation distance along the vertical direction between the gate electrode 23 and the source/drain electrode 22A is the separation distance d2 longer than the separation distance d1 of the portion where the projection 51 is provided (d1<d2).

Figure 12:
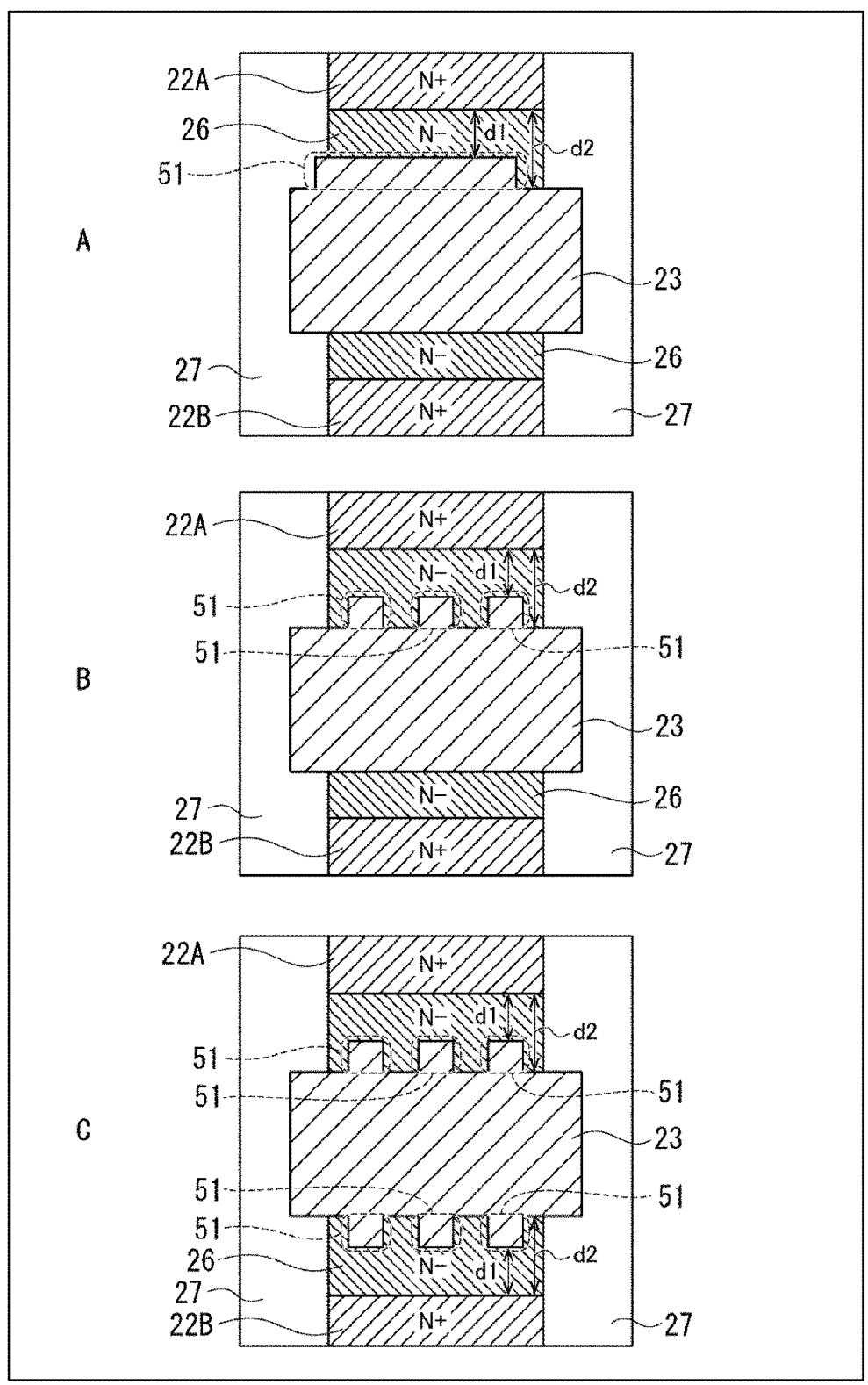
FIG. 12 is a diagram of a modification of the second embodiment.

On the other hand, in the modification illustrated in A of FIG. 12, the left side of the projection 51 of the gate electrode 23 is extended on the element isolation region 27 so that a portion having the separation distance d2 longer than the separation distance d1 of the portion where the projection 51 is formed is provided at only one portion having contact with the element isolation region 27 on the right side. In this way, it is preferable that the portion where the gate electrode 23 has the separation distance d2 longer than the separation distance d1, which is the minimum value be formed at least one of the portions having contact with the element isolation regions 27 on both sides.

Furthermore, a plurality of projections 51 of the gate electrode 23, not the single projection 51 illustrated in FIG. 9 and A of FIG. 12, may be formed as illustrated in B of FIG. 12. In this case, in at least one of the portions having contact with the element isolation regions 27 on both sides, it is preferable that the separation distance along the vertical direction between the gate electrode 23 and the source/drain electrode 22A be the separation distance d2 longer than the minimum separation distance d1.

Furthermore, in the second embodiment described above, the example has been described in which a side of the gate electrode 23 on the side of the source/drain electrode 22A which is one of the source/drain electrodes 22A and 22B has one or more projections 51. However, as illustrated in C of FIG. 12, a side of the gate electrode 23 on the side of the source/drain electrode 22B may have one or more projections 51. In the example in C of FIG. 12, the side of the gate electrode 23 on the side of the source/drain electrode 22B has the shape of the gate electrode 23 having the three projections 51 illustrated in B of FIG. 12. However, the side of the gate electrode 23 on the side of the source/drain electrode 22B may have the shape of the gate electrode 23 on the side of the source/drain electrode 22A in A of FIG. 12 or FIG. 9.

3. Example of Application to Solid-State Imaging Device

<Pixel Circuit of Solid-State Imaging Device>

The transistor 1 described above can be employed as a configuration of a pixel transistor of a solid-state imaging device.

Figure 13:
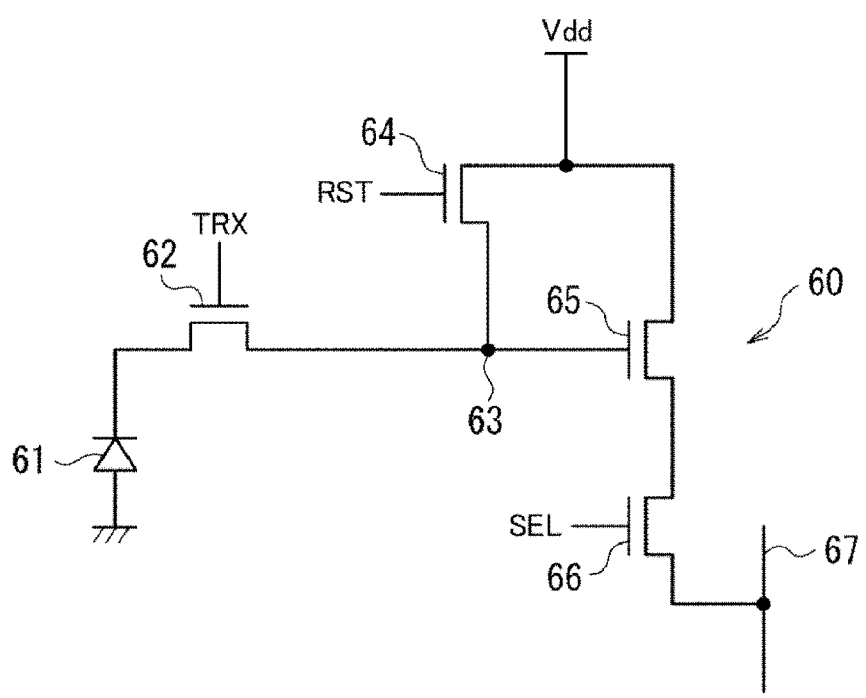
FIG. 13 is a diagram of an exemplary circuit configuration of a pixel of a solid-state imaging device.

FIG. 13 is a diagram of an exemplary circuit configuration of a pixel of the solid-state imaging device.

A pixel 60 includes a photodiode 61 as a photoelectric converter, a transfer transistor 62, a floating diffusion (FD) 63, a reset transistor 64, an amplification transistor 65, and a selection transistor 66.

The photodiode 61 generates and accumulates charges (signal charge) according to a received light amount. An anode terminal of the photodiode 61 is grounded, and a cathode terminal is connected to the FD 63 via the transfer transistor 62.

When being turned on by a transfer signal TRX, the transfer transistor 62 reads the charge generated by the photodiode 61 and transfers the read charge to the FD 63.

The FD 63 holds the charges transferred from the photodiode 61 for a predetermined period to read the hold charges. When being turned on by a reset signal RST, the reset transistor 64 resets a potential of the FD 63 by discharging the charges accumulated in the FD 63 to a drain (constant voltage source Vdd).

The amplification transistor 65 outputs a pixel signal according to the potential of the FD 63. That is, the amplification transistor 65 forms a source follower circuit together with a load MOS (not shown) connected as a constant current source connected via a vertical signal line 67, and the pixel signal indicating a level according to the charges accumulated in the FD 63 is output from the amplification transistor 65 via the selection transistor 66.

The selection transistor 66 is turned on when the pixel 60 is selected by the selection signal SEL and outputs the pixel signal of the pixel 60 to the outside of the pixel via the vertical signal line 67. Each of signal lines through which the transfer signal TRX, the selection signal SEL, and the reset signal RST are respectively transmitted corresponds to, for example, a pixel drive line 110 in FIG. 15 to be described later.

Although the pixel 60 can be configured as described above, the circuit configuration of the pixel 60 is not limited to this, and other configurations can be employed.

In a case where the pixel 60 is configured as described above, for example, the structure of the transistor 1 described above can be employed relative to the transfer transistor 62, the FD 63, and the reset transistor 64.

Figure 14:
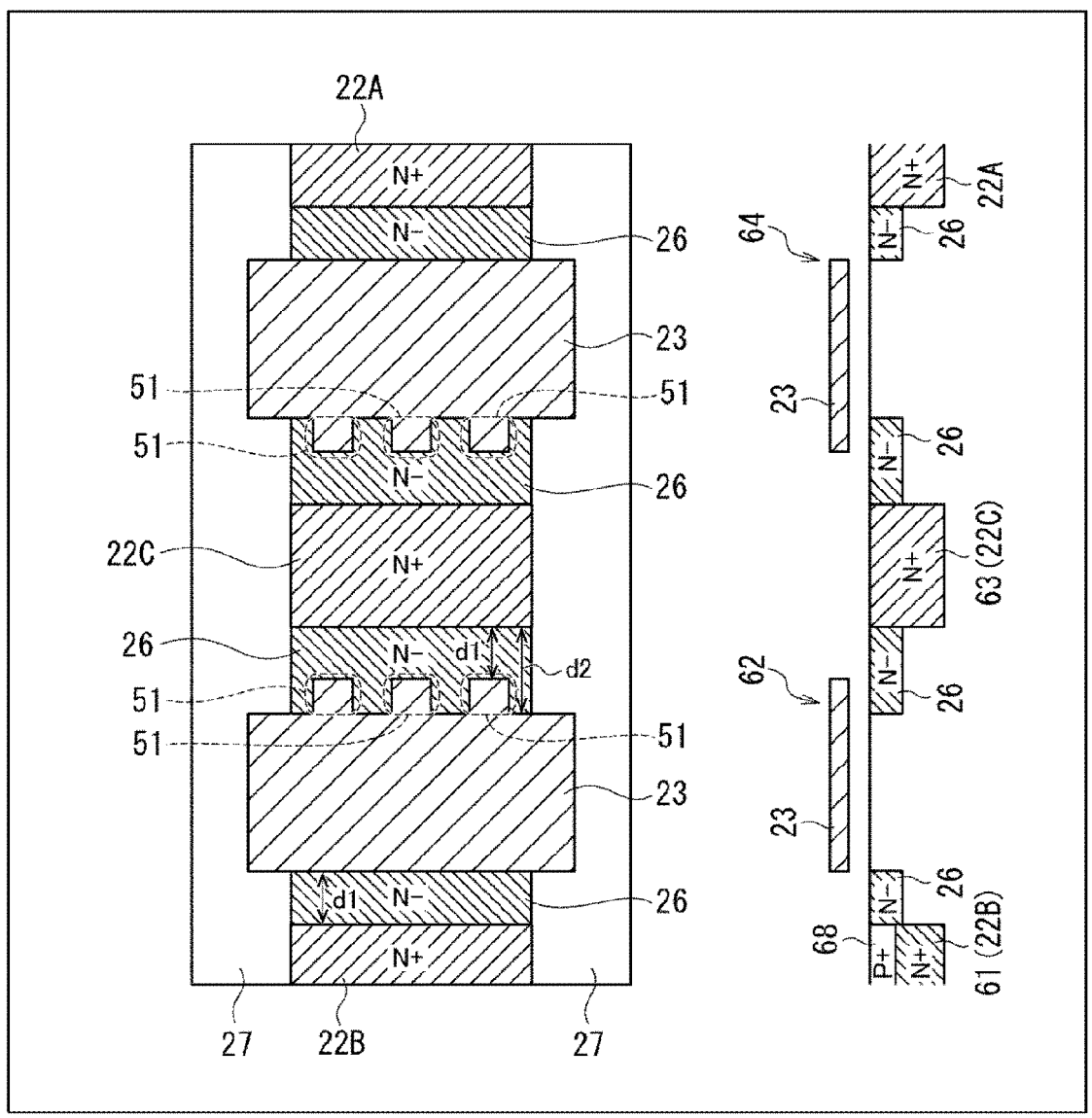
FIG. 14 is a diagram of an example in which a transistor structure according to the second embodiment is employed for a pixel transistor.

In FIG. 14, an example is illustrated in which the transistor structure according to the second embodiment described above is employed relative to the transfer transistor 62, the FD 63, and the reset transistor 64.

A source/drain electrode 22C shared by the transfer transistor 62 and the reset transistor 64 also serves as the FD 63. Each of planar shapes of the gate electrodes 23 of the transfer transistor 62 and the reset transistor 64 has one or more projections 51 on the side of the source/drain electrode 22C as the FD 63.

Note that, as illustrated in the schematic cross-sectional view, a high-concentration P-type pinning layer 68 is normally formed on the outermost surface of the high-concentration N-type source/drain electrode 22B where the photodiode 61 is formed. However, the pinning layer 68 is not illustrated in the plan view.

In this way, by employing the structure of the transistor 1 including the gate electrode 23 having one or more projections 51 on the side of the source/drain electrode 22C which functions as the FD 63 and is shared by the transfer transistor 62 and the reset transistor 64, a parasitic capacitance between the gate electrode 23 and the source/drain electrode 22C can be reduced, and a leakage current of the FD 63 can be reduced.

Note that, in the example described above, the configuration in which the source/drain electrode 22C is shared by the transfer transistor 62 and the reset transistor 64 is described. However, it is preferable that the source/drain electrodes be separately provided for the transfer transistor 62 and the reset transistor 64 without sharing the single source/drain electrode by the transfer transistor 62 and the reset transistor 64.

Furthermore, in the example in FIG. 14, as the structures of the transfer transistor 62 and the reset transistor 64, the transistor structure according to the second embodiment of the transistor 1 described above is employed. However, the transistor structure according to the first embodiment may be employed, and the transistor structure according to the modification of the first embodiment or the second embodiment may be employed.

Furthermore, both the transfer transistor 62 and the reset transistor 64 do not necessarily have the structure of the transistor 1, and only one of the transfer transistor 62 and the reset transistor 64 may have the structure of the transistor 1.

<Schematic Configuration Example of Solid-State Imaging Device>

Figure 15:
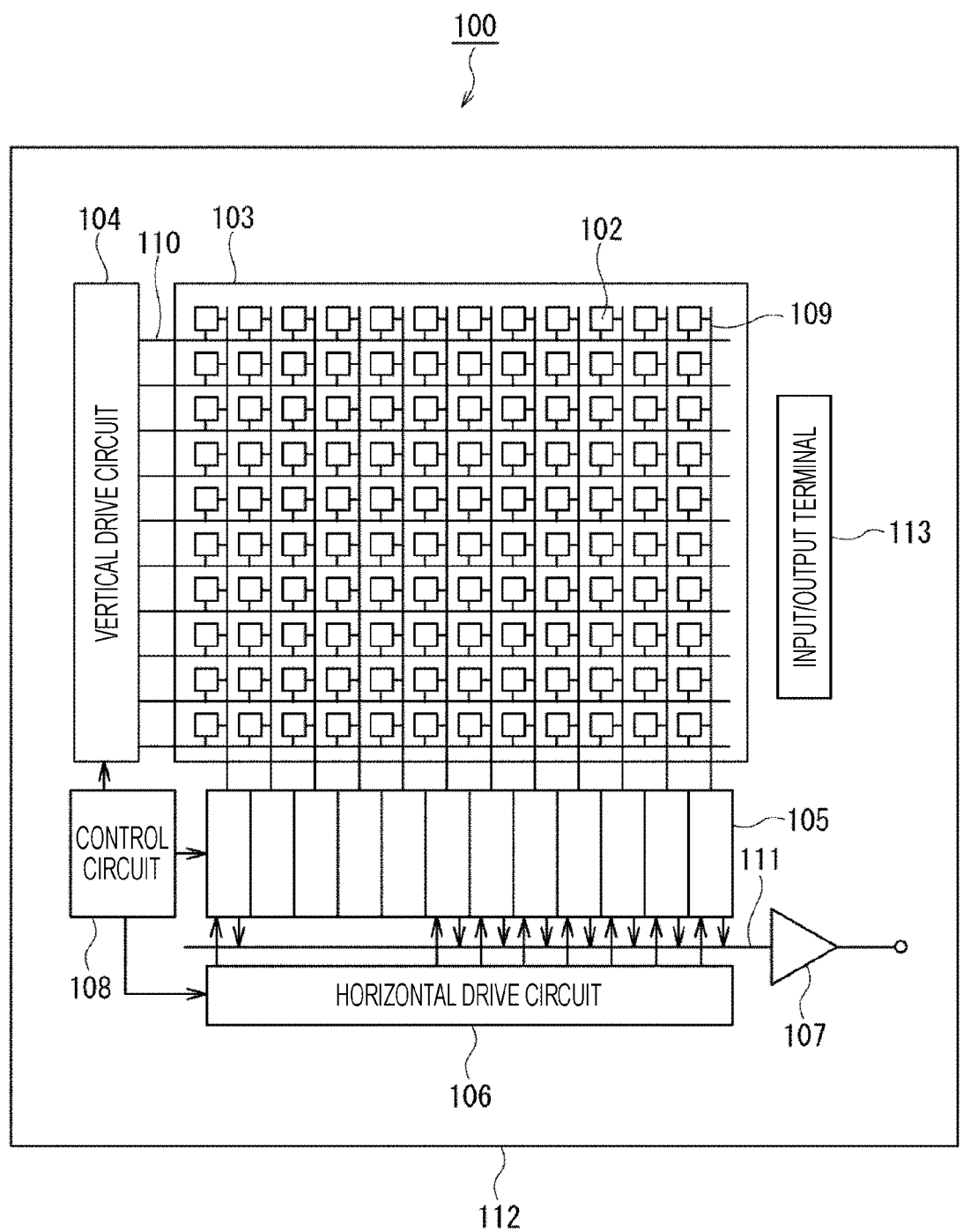
FIG. 15 is a diagram of a schematic configuration of a solid-state imaging device having a pixel structure illustrated in FIGS. 13 and 14.

FIG. 15 is a diagram of a schematic configuration of the solid-state imaging device having the pixel structure illustrated in FIGS. 13 and 14.

A solid-state imaging device 100 illustrated in FIG. 15 includes a pixel array unit 103 in which pixels 102 are arranged in a two-dimensional array and peripheral circuits around the pixel array unit 103 which are formed on a semiconductor substrate 112 using, for example, silicon (Si) as a semiconductor. The peripheral circuits include a vertical drive circuit 104, column signal processing circuits 105, a horizontal drive circuit 106, an output circuit 107, a control circuit 108, and the like.

For the pixel 102 formed in the pixel array unit 103, for example, the pixel structure described with reference to FIGS. 13 and 14 is employed.

The control circuit 108 receives an input clock and data for instructing an operation mode and the like and outputs data such as internal information of the solid-state imaging device 100. That is, on the basis of a vertical synchronization signal, a horizontal synchronization signal, and a master clock, the control circuit 108 generates a clock signal to be a reference of operations of the vertical drive circuit 104, the column signal processing circuit 105, the horizontal drive circuit 106, and the like, and a control signal. Then, the control circuit 108 outputs the generated clock signal and control signal to the vertical drive circuit 104, the column signal processing circuit 105, the horizontal drive circuit 106, and the like.

The vertical drive circuit 104 includes, for example, a shift resistor. The vertical drive circuit 104 selects a predetermined pixel drive wiring 110 and supplies a pulse to drive the pixels 102 to the selected pixel drive wiring 110, and drives the pixels 102 in units of rows. That is, the vertical drive circuit 104 sequentially selects and scans the pixels 102 in the pixel array unit 103 in units of rows along the vertical direction, and makes the column signal processing circuit 105 supply the pixel signal based on the signal charge generated by the photoelectric converter of each pixel 102 according to a light receiving amount through the vertical signal line 109.

The column signal processing circuit 105 is arranged for each column of the pixels 102 and performs signal processing such as noise removal on the signals output from the pixels 102 in the single row for each pixel column. For example, the column signal processing circuit 105 performs the signal processing such as Correlated Double Sampling (CDS) to remove fixed pattern noises specific to the pixels and AD conversion.

The horizontal drive circuit 106 includes, for example, a shift resistor. By sequentially outputting horizontal scanning pulses, the horizontal drive circuit 106 selects each of the column signal processing circuits 105 in order, and makes each column signal processing circuit 105 output the pixel signal to a horizontal signal line 111.

The output circuit 107 performs signal processing on the signals sequentially supplied from each column signal processing circuit 105 through the horizontal signal line 111 and outputs the processed signal. For example, the output circuit 107 may only perform buffering and may perform black level adjustment, column variation correction, various digital signal processing, and the like. An input/output terminal 113 exchanges signals with the outside.

The solid-state imaging device 100 formed as described above is a CMOS image sensor referred to as a column AD method in which the column signal processing circuit 105 for performing CDS processing and AD conversion processing is arranged for each pixel column.

As the pixel transistor of the pixel 102 of such a solid-state imaging device 100, the configurations of the embodiments of the transistor 1 described above or the modification of embodiments can be employed.

4. Example of Application to Electronic Device

The present technology is not limited to application to a solid-state imaging device. That is, the present technology can be applied to all kinds of electronic devices using a solid-state imaging device in a pixel capturing unit (photoelectric converter) such as an imaging device including a digital still camera, a video camera, and the like, a mobile terminal device having an imaging function, a copying machine using the solid-state imaging device in the image capturing unit. The solid-state imaging device may have a form formed as a single chip and may be a module-like shape having an imaging function in which an imaging unit, a signal processing unit or an optical system are collectively packaged.

Figure 16:
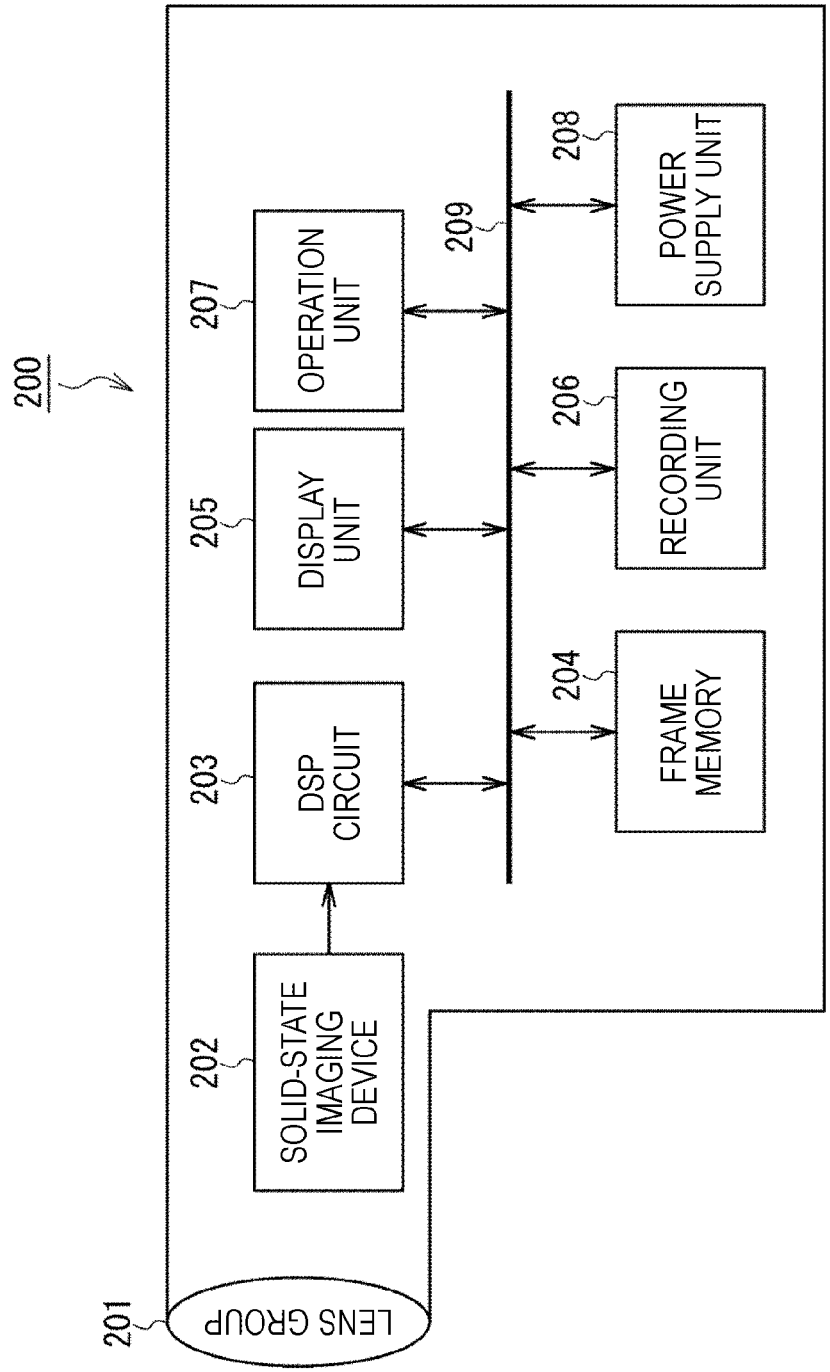
FIG. 16 is a block diagram of an exemplary configuration of an imaging device as an electronic device to which the present technology is applied.

FIG. 16 is a block diagram of an exemplary configuration of an imaging device as an electronic device to which the present technology is applied.

An imaging device 200 in FIG. 16 includes an optical unit 201 including a lens group and the like, a solid-state imaging device (imaging device) 202 employing the configuration of the solid-state imaging device 100 in FIG. 15, and a Digital Signal Processor (DSP) circuit 203 which is a camera signal processing circuit. Furthermore, the imaging device 200 includes a frame memory 204, a display unit 205, a recording unit 206, an operation unit 207, and a power supply unit 208. The DSP circuit 203, the frame memory 204, the display unit 205, the recording unit 206, the operation unit 207, and the power supply unit 208 are mutually connected to each other via a bus line 209.

The optical unit 201 captures incident light (image light) from a subject and forms an image on an imaging surface of the solid-state imaging device 202. The solid-state imaging device 202 converts a light amount of the incident light imaged on the imaging surface by the optical unit 201 into an electric signal in pixel units and outputs the converted signals as a pixel signal. As the solid-state imaging device 202, the solid-state imaging device 100 in FIG. 15, that is, the solid-state imaging device having the pixels 102 having the pixel transistor structure for reducing a parasitic capacitance and reducing a leakage current of the FD 63 can be used.

The display unit 205 includes, for example, a panel type display device such as a liquid crystal panel and an organic Electro Luminescence (EL) panel and displays a moving image or a still image imaged by the solid-state imaging device 202. The recording unit 206 records the moving image or the still image imaged by the solid-state imaging device 202 on a recording medium such as a hard disk or a semiconductor memory.

The operation unit 207 issues an instruction for operating various functions of the imaging device 200 under a user's operation. The power supply unit 208 appropriately supplies various power sources to be an operation power source of the DSP circuit 203, the frame memory 204, the display unit 205, the recording unit 206, and the operation unit 207 to the components which are supply targets.

As described above, by using the solid-state imaging device 100 including one or more pixel transistors having the structure of the transistor 1 described above as the solid-state imaging device 202, the leakage current can be reduced. Accordingly, even in the imaging device 200 such as a video camera, a digital still camera, and a camera module for a mobile device such as a cellular phone, an image quality of the imaged image can be enhanced.

<Exemplary Usage of Image Sensor>

Figure 17:
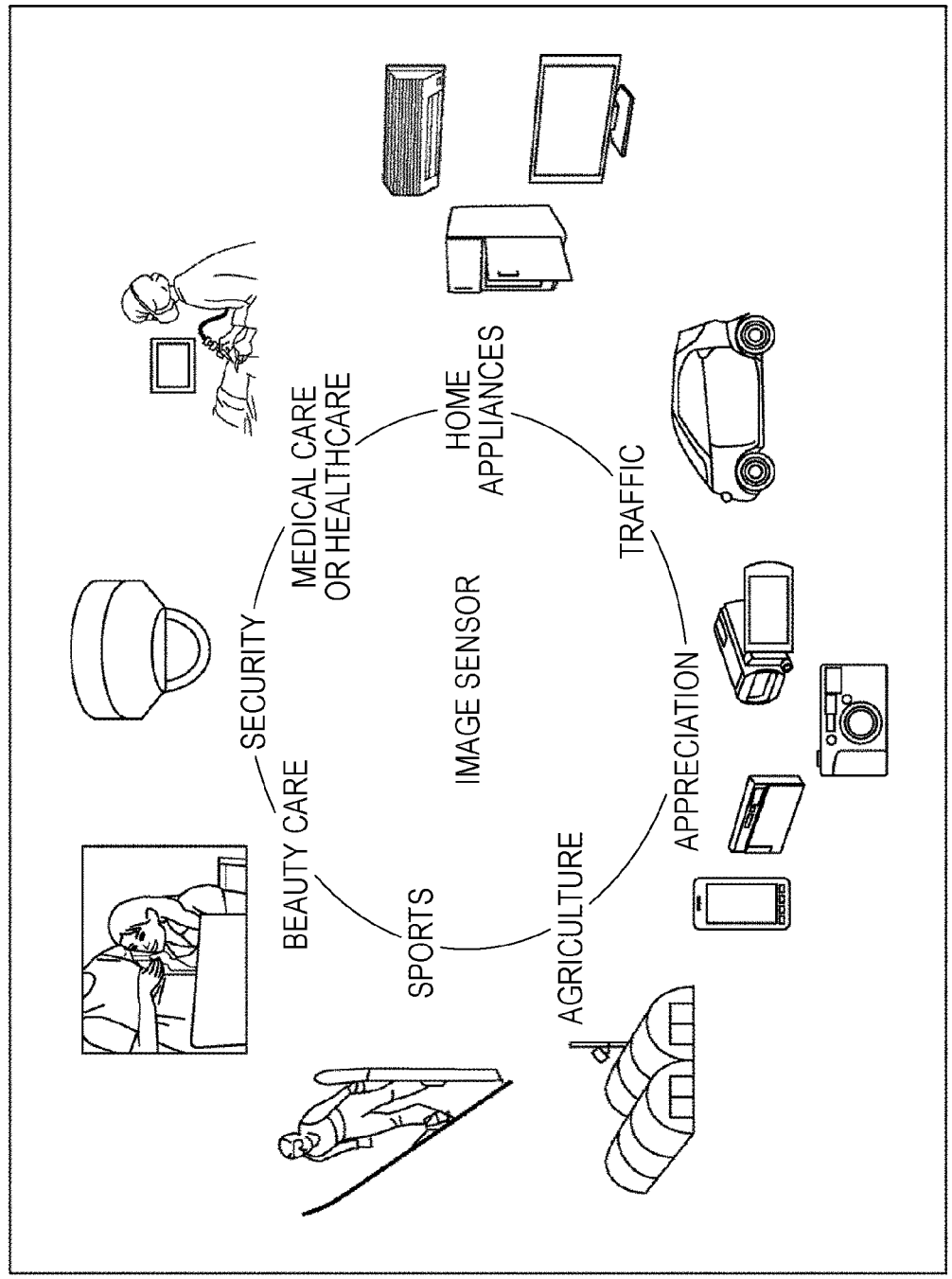
FIG. 17 is a diagram to describe an exemplary usage of the solid-state imaging device in FIG. 16.

FIG. 17 is a diagram of an exemplary usage of an image sensor using the solid-state imaging device 100 described above.

The image sensor using the solid-state imaging device 100 described above can be used, for example, in various cases in which light such as visible light, infrared light, ultraviolet light, and X-rays are sensed as follows.

- A device which images an image to be used for appreciation, such as a digital camera and a portable device with a camera function
- A device which is used for traffic, such as an in-vehicle sensor for imaging the front, rear, surroundings, inside, and the like of a car for safe driving such as automatic stop, recognition of a driver's state, and the like, a monitoring camera for monitoring a traveling vehicle and a road, a distance measuring sensor for measuring a distance between vehicles, and the like
- A device which is used for home appliances, such as a TV, a refrigerator, an air conditioner to image a gesture of a user and operates the device according to the gesture
- A device which used for medical care and healthcare, such as an endoscope, a device for angiography by receiving infrared light
- A device which is used for security, such as a security monitoring camera, a camera for person authentication
- A device which is used for beauty care, such as a skin measuring instrument for photographing skin, a microscope for photographing a scalp
- A device which is used for sports, such as an action camera and a wearable camera for sports and the like
- A device which is used for agriculture, such as a camera for monitoring conditions of fields and crops In the example described above, the pixel structure in which electrons are used as signal charges has been described as assuming that the first conductivity type be the P type and the second conductivity type be the N type. However, the present technology can be applied to a pixel structure in which holes are used as signal charges. That is, as assuming that the first conductivity type be the N type and the second conductivity type be the P type, semiconductor regions having opposite conductivity types from those of the semiconductor regions described above can be used.

Furthermore, the application of the present technology is not limited to an application to the solid-state imaging device for detecting a distribution of an amount of incident light of visible light and images the distribution as an image. The present technology can be applied to all solid-state imaging devices (physical quantity distribution detection device) in the broad sense such as a solid-state imaging device which images a distribution of an entered amount of infrared rays, X-rays, particles, or the like as an image and a fingerprint detection sensor which detects a distribution of other physical quantity, such as a pressure and an electrostatic capacitance and images an image.

Furthermore, the present technology can be applied to all semiconductor devices having not only the solid-state imaging device but also other semiconductor circuits.

The embodiment of the present technology is not limited to the above-mentioned embodiments, and various changes can be made without departing from the scope of the present technology.

For example, a form in which a part of or all of the plurality of embodiments are combined can be employed.

Furthermore, the effects described herein are only exemplary and not limited to these. There may be an effect other than those described herein.

Note that, the present technology can have the configuration below.

(1) A Semiconductor Device Including:

a first impurity region formed between element isolation regions on both sides;

a gate electrode formed on an upper surface of a semiconductor substrate where the element isolation regions and the first impurity region are formed so that both ends are respectively overlapped with the element isolation regions on both sides and the gate electrode is separated from the first impurity region by a predetermined distance along a planar direction; and a second impurity region formed on the semiconductor substrate between the gate electrode and the first impurity region in plan view as having the same conductivity type as the first impurity region, in which there are at least two kinds of separation distances between the gate electrode and the first impurity region along the planar direction, that is, a first distance and a second distance, and the separation distance of a portion having contact with at least one of the element isolation regions is the second distance longer than the first distance.

(2) The semiconductor device according to (1), in which a concentration of the second impurity region is lower than a concentration of the first impurity region.

(3) The semiconductor device according to (1) or (2), in which the gate electrode has one or more projections projected toward the first impurity region in plan view.

(4) The semiconductor device according to any one of (1) to (3), in which the gate electrode includes a plurality of projections projected toward the first impurity region in plan view.

(5) The semiconductor device according to (3) or (4), in which a distance from the projection closest to the element isolation region to the element isolation region is the same as or shorter than a minimum value of the separation distance.

(6) The semiconductor device according to any one of (3) to (5), in which the distance from the projection closest to the element isolation region to the element isolation region is the same as or shorter than a width of a sidewall formed on a side surface of the gate electrode.

(7) The semiconductor device according to (1) or (2), in which the second impurity region has one or more projections projected toward the first impurity region in plan view.

(8) The semiconductor device according to (1) or (2), in which the second impurity region has a plurality of projections projected toward the first impurity region in plan view.

(9) The semiconductor device according to any one of (1) to (8), in which the separation distance of each of portions respectively having contact with the element isolation regions on both sides is the second distance.

(10) A manufacturing method of a semiconductor device including:

forming a first impurity region between element isolation regions on both sides;

forming a gate electrode on an upper surface of a semiconductor substrate where the element isolation regions and the first impurity region are formed so that both ends are respectively overlapped with the element isolation regions on both sides and the gate electrode is separated from the first impurity region by a predetermined distance along a planar direction; and forming a second impurity region on the semiconductor substrate between the gate electrode and the first impurity region in plan view as having the same conductivity type as the first impurity region, in which there are at least two kinds of separation distances between the gate electrode and the first impurity region along the planar direction, that is, a first distance and a second distance, and the separation distance of a portion having contact with at least one of the element isolation regions is formed to be the second distance longer than the first distance.

(11) A solid-state imaging device including:

a photoelectric converter configured to generate a charge according to a received light amount and accumulate the charge;

a charge holding unit configured to hold the charge generated by the photoelectric converter to read the charge;

a transfer transistor configured to transfer the charge from the photoelectric converter to the charge holding unit; and a reset transistor configured to reset the charge holding unit, in which the charge holding unit is formed by a first impurity region formed between element isolation regions on both sides, one of or both of gate electrodes of the transfer transistor or the reset transistor are formed on an upper surface of a semiconductor substrate where the element isolation regions and the first impurity region are formed so that both ends are respectively overlapped with the element isolation regions on both sides and the gate electrode is separated from the first impurity region by a predetermined distance along the planar direction, a second impurity region having the same conductivity type as the first impurity region is formed on the semiconductor substrate between the gate electrode and the first impurity region in plan view, and there are at least two kinds of separation distances between the gate electrode and the first impurity region along a planar direction, that is, a first distance and a second distance, and the separation distance of a portion having contact with at least one of the element isolation regions is the second distance longer than the first distance.

(12) The solid-state imaging device according to (11), in which a concentration of the second impurity region is lower than a concentration of the first impurity region.

(13) The solid-state imaging device according to (11) or (12), in which the gate electrode has one or more projections projected toward the first impurity region in plan view.

(14) The solid-state imaging device according to any one of (11) to (13), in which the gate electrode includes a plurality of projections projected toward the first impurity region in plan view.

(15) The solid-state imaging device according to (13) or (14), in which a distance from the projection closest to the element isolation region to the element isolation region is the same as or shorter than a minimum value of the separation distance.

(16) The solid-state imaging device according to any one of (13) to (15), in which the distance from the projection closest to the element isolation region to the element isolation region is the same as or shorter than a width of a sidewall formed on a side surface of the gate electrode.

(17) The solid-state imaging device according to (11) or (12), in which the second impurity region has one or more projections projected toward the first impurity region in plan view.

(18) The solid-state imaging device according to (11) or (12), in which the second impurity region has a plurality of projections projected toward the first impurity region in plan view.

(19) The solid-state imaging device according to any one of (11) to (18), in which the separation distance of each of portions respectively having contact with the element isolation regions on both sides is the second distance.

(20) An electronic device including:

a solid-state imaging device including:

a photoelectric converter which generates a charge according to a received light amount and accumulates the charge;

a charge holding unit which holds the charge generated by the photoelectric converter to read the charge;

a transfer transistor which transfers the charge from the photoelectric converter to the charge holding unit; and a reset transistor which resets the charge holding unit, in which the charge holding unit is formed by a first impurity region formed between element isolation regions on both sides, one of or both of gate electrodes of the transfer transistor or the reset transistor are formed on an upper surface of a semiconductor substrate where the element isolation regions and the first impurity region are formed so that both ends are respectively overlapped with the element isolation regions on both sides and the gate electrode is separated from the first impurity region by a predetermined distance along a planar direction,
a second impurity region having the same conductivity type as the first impurity region is formed on the semiconductor substrate between the gate electrode and the first impurity region in plan view, and
there are at least two kinds of separation distances between the gate electrode and the first impurity region along a planar direction, that is, a first distance and a second distance, and the separation distance of a portion having contact with at least one of the element isolation regions is the second distance longer than the first distance.

REFERENCE SIGNS LIST 1 transistor
21 semiconductor substrate
22A, 22B, 22C N-type impurity region (source/drain electrode)
23 gate electrode
24 sidewall
25 N-type impurity region
27 element isolation region
31 projection
d1 first separation distance
d3 second separation distance
41, 42 resist
51 projection
60 pixel
61 photodiode
62 transfer transistor
63 floating diffusion (FD)
64 reset transistor
72 reference signal generating unit
100 solid-state imaging device
101 imaging device
102 pixel
104 solid-state imaging device
200 imaging device
202 solid-state imaging device

The invention claimed is:
1. A semiconductor device comprising:
a first impurity region formed between element isolation regions on both sides;
a gate electrode formed on an upper surface of a semiconductor substrate where the element isolation regions and the first impurity region are formed so that both ends are respectively overlapped with the element isolation regions on both sides and the gate electrode is separated from the first impurity region by a predetermined distance along a planar direction; and
a second impurity region formed on the semiconductor substrate between the gate electrode and the first impurity region in plan view, wherein the second impurity region has the same conductivity type as the first impurity region, and wherein
there are at least two kinds of separation distances between the gate electrode and the first impurity region along the planar direction, that is, a first distance and a second distance, and the separation distance of a portion having contact with at least one of the element isolation regions is the second distance, which is longer than the first distance.

2. The semiconductor device according to claim 1, wherein
a concentration of the second impurity region is lower than a concentration of the first impurity region.
3. The semiconductor device according to claim 1, wherein
the gate electrode has one or more projections projected toward the first impurity region in plan view.
4. The semiconductor device according to claim 1, wherein
the gate electrode has a plurality of projections projected toward the first impurity region in plan view.
5. The semiconductor device according to claim 3, wherein
a distance from the projection closest to the element isolation region is the same as or shorter than a minimum value of the separation distance.
6. The semiconductor device according to claim 3, wherein
the distance from the projection closest to the element isolation region to the element isolation region is the same as or shorter than a width of a sidewall formed on a side surface of the gate electrode.
7. The semiconductor device according to claim 1, wherein
the second impurity region has one or more projections projected toward the first impurity region in plan view.
8. The semiconductor device according to claim 1, wherein
the second impurity region has a plurality of projections projected toward the first impurity region in plan view.
9. The semiconductor device according to claim 1, wherein
the separation distance of each of portions respectively having contact with the element isolation regions on both sides is the second distance.
10. A manufacturing method of a semiconductor device comprising:
forming a first impurity region between element isolation regions on both sides;
forming a gate electrode on an upper surface of a semiconductor substrate where the element isolation regions and the first impurity region are formed so that both ends are respectively overlapped with the element isolation regions on both sides and the gate electrode is separated from the first impurity region by a predetermined distance along a planar direction; and
forming a second impurity region on the semiconductor substrate between the gate electrode and the first impurity region in plan view, wherein the second impurity region has the same conductivity type as the first impurity region, and wherein
there are at least two kinds of separation distances between the gate electrode and the first impurity region along the planar direction, that is, a first distance and a second distance, and the separation distance of a portion having contact with at least one of the element isolation regions is formed to be the second distance, which is longer than the first distance.
11. A solid-state imaging device comprising:
a photoelectric converter configured to generate a charge according to a received light amount and accumulate the charge;
a charge holding unit configured to hold the charge generated by the photoelectric converter to read the charge;

a transfer transistor configured to transfer the charge from the photoelectric converter to the charge holding unit; and a reset transistor configured to reset the charge holding unit, wherein the charge holding unit is formed by a first impurity region formed between element isolation regions on both sides, one of or both of gate electrodes of the transfer transistor or the reset transistor are formed on an upper surface of a semiconductor substrate where the element isolation regions and the first impurity region are formed so that both ends are respectively overlapped with the element isolation regions on both sides and the gate electrode is separated from the first impurity region by a predetermined distance along the planar direction, a second impurity region having the same conductivity type as the first impurity region is formed on the semiconductor substrate between the gate electrode and the first impurity region in plan view, and there are at least two kinds of separation distances between the gate electrode and the first impurity region along a planar direction, that is, a first distance and a second distance, and the separation distance of a portion having contact with at least one of the element isolation regions is the second distance, which is longer than the first distance.

12. The solid-state imaging device according to claim 11, wherein
a concentration of the second impurity region is lower than a concentration of the first impurity region.

13. The solid-state imaging device according to claim 11, wherein
the gate electrode has one or more projections projected toward the first impurity region in plan view.

14. The solid-state imaging device according to claim 11, wherein
the gate electrode includes a plurality of projections projected toward the first impurity region in plan view.

15. The solid-state imaging device according to claim 13, wherein
a distance from the projection closest to the element isolation region to the element isolation region is the same as or shorter than a minimum value of the separation distance.

16. The solid-state imaging device according to claim 13, wherein
the distance from the projection closest to the element isolation region to the element isolation region is the same as or shorter than a width of a sidewall formed on a side surface of the gate electrode.

17. The solid-state imaging device according to claim 11, wherein
the second impurity region has one or more projections projected toward the first impurity region in plan view.

18. The solid-state imaging device according to claim 11, wherein
the second impurity region has a plurality of projections projected toward the first impurity region in plan view.

19. The solid-state imaging device according to claim 11, wherein
the separation distance of each of portions respectively having contact with the element isolation regions on both sides is the second distance.

20. An electronic device comprising:
a solid-state imaging device including:
a photoelectric converter which generates a charge according to a received light amount and accumulates the charge;
a charge holding unit which holds the charge generated by the photoelectric converter to read the charge;
a transfer transistor which transfers the charge from the photoelectric converter to the charge holding unit; and
a reset transistor which resets the charge holding unit, wherein
the charge holding unit is formed by a first impurity region formed between element isolation regions on both sides,
one of or both of gate electrodes of the transfer transistor or the reset transistor are formed on an upper surface of a semiconductor substrate where the element isolation regions and the first impurity region are formed so that both ends are respectively overlapped with the element isolation regions on both sides and the gate electrode is separated from the first impurity region by a predetermined distance along a planar direction,
a second impurity region having the same conductivity type as the first impurity region is formed on the semiconductor substrate between the gate electrode and the first impurity region in plan view, and
there are at least two kinds of separation distances between the gate electrode and the first impurity region along a planar direction, that is, a first distance and a second distance, and the separation distance of a portion having contact with at least one of the element isolation regions is the second distance, which is longer than the first distance.

* * * * *